US012796232B2

(12) United States Patent
Choi et al.

(10) Patent No.: US 12,796,232 B2
(45) Date of Patent: Nov. 10, 2026

(54) LIGHT EMITTING DISPLAY DEVICE

(71) Applicant: Samsung Display Co., Ltd., Yongin-si (KR)

(72) Inventors: Kook Hyun Choi, Yongin-si (KR); Choong Youl Im, Yongin-si (KR); Ha Seok Jeon, Yongin-si (KR); Beohm Rock Choi, Yongin-si (KR); Seong-Yong Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 435 days.

(21) Appl. No.: 18/508,870

(22) Filed: Nov. 14, 2023

(65) Prior Publication Data

US 2024/0244891 A1 Jul. 18, 2024

(30) Foreign Application Priority Data

Jan. 18, 2023 (KR) ........................ 10-2023-0007347
May 2, 2023 (KR) ........................ 10-2023-0057244

(51) Int. Cl.
*H10K 59/122* (2023.01)
*H10K 59/38* (2023.01)
(Continued)

(52) U.S. Cl.
CPC ........... *H10K 59/122* (2023.02); *H10K 59/38* (2023.02); *H10K 59/873* (2023.02); *H10K 59/8792* (2023.02); *H10K 2102/311* (2023.02)

(58) Field of Classification Search
CPC .... H10K 59/122; H10K 59/38; H10K 59/873; H10K 59/8792; H10K 2102/311; H10K 59/353
(Continued)

(56) References Cited

U.S. PATENT DOCUMENTS 10,896,939 B2 1/2021 Jeon et al.
11,869,268 B2 1/2024 Hu
(Continued)

FOREIGN PATENT DOCUMENTS

CN 111192978 A 5/2020
CN 113327961 A 8/2021
(Continued)

OTHER PUBLICATIONS

Korean Office Action for KR Application No. 10-2023-0057244, dated Apr. 29, 2025, 10 pages.
(Continued)

*Primary Examiner* — Christopher M Raabe
(74) *Attorney, Agent, or Firm* — Womble Bond Dickinson (US) LLP

(57) ABSTRACT

A light emitting display device includes a substrate, a plurality of anodes on the substrate, a pixel defining layer having a plurality of first openings overlapping the anodes, a plurality of emission layers in the first openings of the pixel defining layer, a cathode formed on the emission layers and the pixel defining layer, an encapsulation layer on the cathode, and a light blocking layer on the encapsulation layer and having a plurality of second openings corresponding to the first openings, wherein the first openings and the second openings respectively have an oval shape in a plan view, and wherein long-axis angles of the second openings include at least five different angles.

19 Claims, 45 Drawing Sheets

(51) Int. Cl.
*H10K 59/80* (2023.01)
*H10K 102/00* (2023.01)

(58) Field of Classification Search
USPC .................................................. 313/498–512
See application file for complete search history.

(56) References Cited

U.S. PATENT DOCUMENTS

| | | | | |
|---|---|---|---|---|
| 2016/0104750 | A1 | 4/2016 | Jinta et al. | |
| 2020/0203441 | A1 | 6/2020 | Zhao | |
| 2021/0134889 | A1* | 5/2021 | Zhang | H10K 59/121 |
| 2021/0265434 | A1 | 8/2021 | Wu et al. | |
| 2022/0140288 | A1 | 5/2022 | Ji et al. | |
| 2022/0376213 | A1* | 11/2022 | Ma | H10K 59/38 |
| 2023/0298377 | A1 | 9/2023 | Hu | |
| 2023/0354680 | A1 | 11/2023 | Li et al. | |
| 2023/0397457 | A1* | 12/2023 | Cai | H10K 59/875 |
| 2024/0032399 | A1 | 1/2024 | Wang | |
| 2024/0040914 | A1 | 2/2024 | Yuan et al. | |
| 2024/0054807 | A1 | 2/2024 | Hu | |
| 2024/0168598 | A1 | 5/2024 | He et al. | |
| 2024/0179989 | A1 | 5/2024 | Chen et al. | |
| 2024/0427446 | A1 | 12/2024 | Wang | |

FOREIGN PATENT DOCUMENTS

| | | | |
|---|---|---|---|
| CN | 113745431 | A | 12/2021 |
| CN | 215578574 | U | 1/2022 |
| CN | 114023904 | A | 2/2022 |
| CN | 215834530 | U | 2/2022 |
| CN | 215834552 | U | 2/2022 |
| EP | 4 095 924 | A1 | 11/2022 |
| JP | 2020-013695 | A | 1/2020 |
| KR | 10-2014-0123002 | A | 10/2014 |
| KR | 10-2016-0015203 | A | 2/2016 |
| KR | 10-2016-0035685 | A | 4/2016 |
| KR | 10-2019-0078078 | A | 7/2019 |
| KR | 10-2022-0058716 | A | 5/2022 |
| KR | 10-2022-0083916 | A | 6/2022 |
| KR | 10-2673170 | B1 | 6/2024 |

OTHER PUBLICATIONS

Korean Notice of Allowance issued in corresponding application No. KR 10-2023-0057244, dated Nov. 28, 2025, 7 pages.

Extended European Search Report issued in corresponding EP Application No. 24152330.7, dated Jun. 28, 2024, 11 pages.

* cited by examiner

LIGHT EMITTING DISPLAY DEVICE

CROSS-REFERENCE TO RELATED APPLICATIONS

This application claims priority to and the benefit of Korean Patent Application No. 10-2023-0007347 filed in the Korean Intellectual Property Office on Jan. 18, 2023 and Korean Patent Application No. 10-2023-0057244 filed in the Korean Intellectual Property Office on May 2, 2023, the entire contents of which are incorporated herein by reference.

BACKGROUND

1. Field

Aspects of the present disclosure relate to a light emitting display device.

2. Description of Related Art

Display devices display images, and include liquid crystal displays (LCDs) and organic light emitting diodes (OLEDs). Display devices may be used in, for example, electronic devices such as mobile phones, GPS devices, digital cameras, electronic books, portable gaming devices, and various terminals.

A display device such as the organic light emitting device may be folded or bent by using a flexible substrate.

In addition, in small electronic devices such as portable phones, optical elements such as cameras and optical sensors are formed in the bezel area around the display area, but as the size of the display screen is increased, the size of the peripheral area of the display area gradually decreases, and methods for disposing the camera or the optical sensor on a rear surface of the display area are being developed.

The above information disclosed in this Background section is only for enhancement of understanding of the background of the disclosure, and therefore it may contain information that does not form the prior art that is already known in this country to a person of ordinary skill in the art.

SUMMARY

The present disclosure has been made in an effort to reduce a diffraction pattern generated when external light is reflected or lower reflectance.

The present disclosure has been made in another effort to provide a light emitting display device for reducing color separation of external light or generating a diffraction pattern regardless of an angle.

According to some embodiments of the present disclosure, there is provided a light emitting display device including: a substrate; a plurality of anodes on the substrate; a pixel defining layer having a plurality of first openings overlapping the anodes; a plurality of emission layers in the first openings of the pixel defining layer; a cathode formed on the emission layers and the pixel defining layer; an encapsulation layer on the cathode; and a light blocking layer on the encapsulation layer and having a plurality of second openings corresponding to the first openings, wherein the first openings and the second openings respectively have an oval shape in a plan view, and wherein long-axis angles of the second openings include at least five different angles.

In some embodiments, an angle formed by long-axis directions of respective oval shapes of two of the second openings is less than or equal to 36 degrees.

In some embodiments, one of the second openings has an eccentricity of 0.2 to 0.85.

In some embodiments, the first openings and the second openings overlapping the first openings in a plan view are formed at regular intervals in a plan view.

In some embodiments, one of the first openings and one of the second openings overlapping the one of the first openings in a plan view have a horizontal gap of 4.5 μm to 10 μm.

In some embodiments, long-axis directions of respective oval shapes of one of the first openings and one of the second openings overlapping the one of the first openings in a plan view are the same or form an angle of less than or equal to 10 degrees.

In some embodiments, the light emitting display device further includes: a color filter in the respective second openings.

According to some embodiments of the present disclosure, there is provided a light emitting display device including: a substrate; a plurality of anodes on the substrate; a pixel defining layer having a plurality of first openings overlapping the anodes; a plurality of emission layers in the first openings of the pixel defining layer; a cathode formed on the emission layers and the pixel defining layer; an encapsulation layer on the cathode; a light blocking layer on the encapsulation layer and having a plurality of second openings corresponding to the first openings; and a plurality of color filters in the second openings of the light blocking layer, wherein the first openings and the second openings have oval shapes in a plan view, wherein respective oval shapes of two of the second openings have different eccentricities, and wherein one of the second openings has an eccentricity of 0.2 to 0.85.

In some embodiments, the color filters include a color filter of a first color, a color filter of a second color, and a color filter of a third color, and two of the second openings corresponding to a color filter of a same color have different eccentricities.

In some embodiments, one of the first openings has an eccentricity of 0.2 to 0.85.

In some embodiments, a long-axis angle of the second openings includes at least five directions, and an angle formed by long-axis directions of respective oval shapes is less than or equal to 36 degrees.

In some embodiments, long-axis directions of oval shapes of one of the first openings and one of the second openings overlapping the one of the first openings in a plan view are the same or form an angle of less than or equal to 10 degrees.

In some embodiments, the first openings and the second openings overlapping the same in a plan view are formed at regular intervals in a plan view.

In some embodiments, one of the first openings and one of the second openings overlapping the one of the first openings in a plan view have a horizontal gap of 4.5 μm to 10 μm.

According to some embodiments of the present disclosure, there is provided a light emitting display device including: a substrate; an anode on the substrate; a pixel defining layer having a first opening overlapping the anode; an emission layer in the first opening of the pixel defining layer; a cathode formed on the emission layer and the pixel defining layer; an encapsulation layer on the cathode; and a light blocking layer on the encapsulation layer and having a second opening corresponding to the first opening, wherein the second opening has a shape that is a merging of at least two oval shapes with different eccentricities in a plan view.

In some embodiments, the second opening has a planar shape formed by cutting a first oval shape with first eccentricity and a second oval shape with second eccentricity in a first direction and combining them.

In some embodiments, the first opening or the second opening has an eccentricity of 0.2 to 0.85.

In some embodiments, the second opening includes a plurality of second openings, long-axis angles of the second openings including at least five different directions, and an angle formed by long-axis directions of respective oval shapes is less than or equal to 36 degrees.

In some embodiments, long-axis directions of respective oval shapes of the first opening and the second opening overlapping the same in a plan view are the same or form an angle of less than or equal to 10 degrees.

In some embodiments, the first opening includes a plurality of first openings and the second opening includes a plurality of second openings, and the second openings overlapping the first openings in a plan view are at regular intervals in a plan view or have a horizontal gap of 4.5 μm to 10 μm.

According to some embodiments, the opening of the pixel defining layer and the opening of the light blocking layer are respectively formed in an oval shape, and the angle of the long axis of the oval is arranged in various ways, the eccentricity of the oval shape is formed in various ways, or the oval shape is formed to have a merged structure that combines oval shapes with multiple eccentricities so less color separation of external light may occur or a constant diffraction pattern may occur regardless of the angle. According to some embodiments, the diffraction pattern may be reduced by reducing the ratio at which external light is reflected by using the black pixel defining layer that separates emission layers from each other instead of a polarizer.

DETAILED DESCRIPTION

Figure 1:
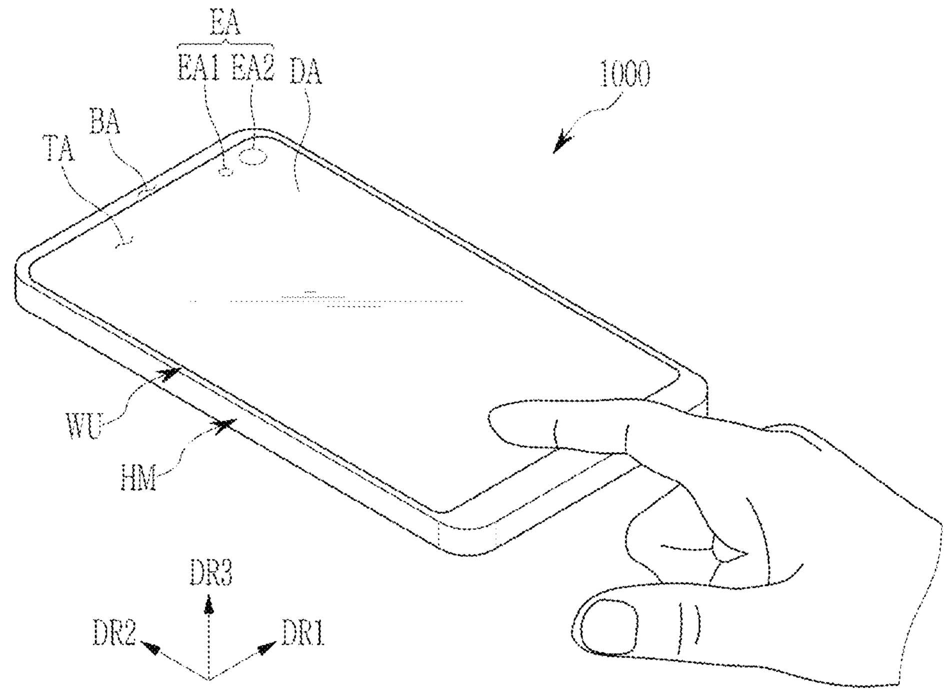
FIG. 1 shows a perspective view of a display device according to some embodiments of the present disclosure.

The present disclosure will be described more fully hereinafter with reference to the accompanying drawings, in which embodiments of the disclosure are shown. As those skilled in the art would realize, the described embodiments may be modified in various different ways, all without departing from the spirit or scope of the present disclosure.

The drawings and description are to be regarded as illustrative in nature and not restrictive. Like reference numerals designate like elements throughout the specification.

The size and thickness of each configuration shown in the drawings are arbitrarily shown for better understanding and ease of description, but the present disclosure is not limited thereto. In the drawings, the thickness of layers, films, panels, regions, etc., are enlarged for clarity. For better understanding and ease of description, the thicknesses of some layers and areas are exaggerated.

The phrase "on a plane" means viewing the object portion from the top, and the phrase "on a cross-section" means viewing a cross-section of which the object portion is perpendicularly cut from the side.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," "comprising," "has," "have," and "having," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. For example, the expression "A and/or B" denotes A, B, or A and B. Expressions such as "one or more of" and "at least one of," when preceding a list of elements, modify the entire list of elements and do not modify the individual elements of the list. For example, the expression "one or more of A, B, and C," "at least one of A, B, or C," "at least one of A, B, and C," and "at least one selected from the group consisting of A, B, and C" indicates only A, only B, only C, both A and B, both A and C, both B and C, or all of A, B, and C.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", "in contact with", "in direct contact with", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

When the parts such as wires, layers, films, regions, plates, or constituent elements are described to extend in the "first direction or the second direction", this not only signifies a straight-line shape running straight in a corresponding direction, but also includes a structure generally extending in the first direction or the second direction, a structure bent on a predetermined portion, a zigzag-shaped structure, or a structure including a curved structure and extending.

Electronic devices (e.g., mobile phones, TVs, monitors, laptop computers, etc.) including the display device and the display panel described in the present specification or the electronic devices including the display device and the display panel manufactured by a manufacturing method described in the specification are not excluded from the claimed range of the present specification.

A structure of a display device will now be described with reference to FIG. 1 to FIG. 3.

FIG. 1 shows a perspective view of a display device according to some embodiments of the present disclosure; FIG. 2 shows an exploded perspective view of a display device according to some embodiments of the present disclosure; and FIG. 3 shows a block diagram of a display device according to some embodiments of the present disclosure.

Referring to FIG. 1, the display device 1000 represents a device for displaying videos or still images, and it may be used as a display screen for portable electronic devices such as mobile phones, smartphones, tablet personal computers (PC), mobile communication terminals, electronic organizers, electronic books, portable multimedia players (PMP), global positioning systems, or ultra mobile PCs (UMPC), and also for various products such as televisions, laptops, monitors, advertisement boards, or internet of things (IOT). The display device 1000 may be used in wearable devices such as smart watches, watch phones, glass-type displays, or head mounted displays (HMD). The display device 1000 may be used as a dashboard of a vehicle, a center information display (CID) disposed on a center fascia or a dashboard of a vehicle, a room mirror display replacing a side-view mirror of a vehicle, and a display disposed on a rear surface of a front seat for entertainment for a back seat of a vehicle. As an examples, FIG. 1 shows that a display device 1000 is used as a smartphone for better comprehension and ease of description.

The display device 1000 may display images in a third direction DR3 from a displaying side that is in parallel to a first direction DR1 and a second direction DR2. The displaying side for displaying images may correspond to a front surface of the display device 1000, and may correspond to a front surface of the cover window WU. The images may include videos and still images.

In some embodiments, front surfaces (or upper surfaces) and rear surfaces (or lower surfaces) of respective members are defined with reference to the image displaying direction. The front surface and the rear surface may oppose each other in the third direction DR3, and normal-line directions of the front surface and the rear surface may be parallel to the third direction DR3. A spaced distance between the front surface and the rear surface in the third direction DR3 may correspond to a thickness of the display panel DP in the third direction DR3.

The display device 1000 may sense a user input (through, e.g., the finger shown in FIG. 1) applied from the outside. The user input may include various types of external inputs such as a part of a human body of the user, light, heat, or pressure. In some embodiments, the user input is shown to be a hand of the user applied to the front surface. However, the present disclosure is not limited thereto. The user input may be provided in various forms, and the display device 1000 may sense the user input applied to the lateral side or the rear surface of the display device 1000 according to the structure of the display device 1000.

Figure 2:
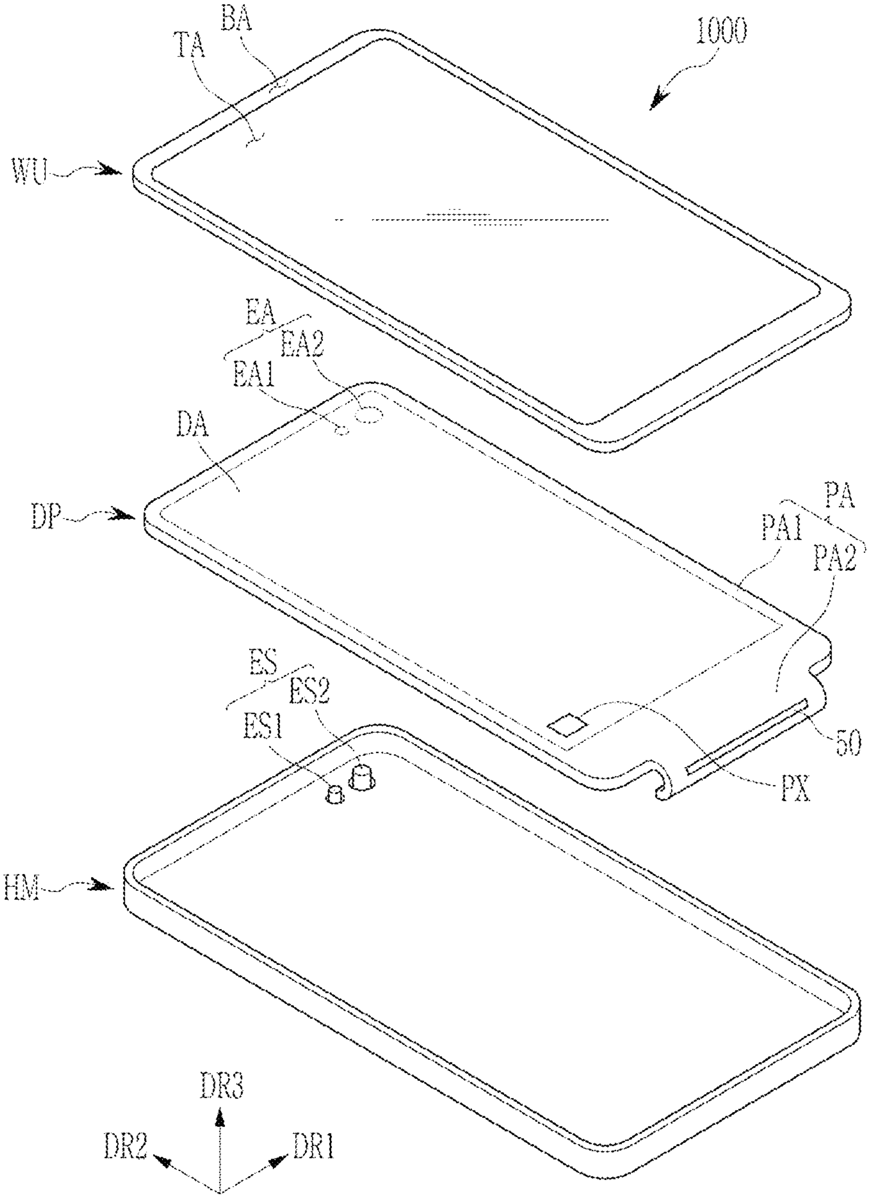
FIG. 2 shows an exploded perspective view of a display device according to some embodiments of the present disclosure.

Referring to FIG. 1 and FIG. 2, the display device 1000 may include a cover window WU, a housing HM, a display panel DP, and an optical element ES. In some embodiments, the cover window WU and the housing HM is combined to form an exterior of the display device 1000.

The cover window WU may include an insulation panel. For example, the cover window WU may be made of glass, plastic, or a combination thereof.

The front surface of the cover window WU may define the front surface of the display device 1000. A transmission area TA may be an optically transparent region. For example, the transmission area TA may have visible ray transmittance of greater than or equal to about 90%.

A blocking area BA may define a shape of the transmission area TA. The blocking area BA may be disposed near the transmission area TA and may surround the transmission area TA. The blocking area BA may have relatively lower light transmittance than the transmission area TA. The blocking area BA may include an opaque material for blocking light. The blocking area BA may have a set or predetermined color. The blocking area BA may be defined by a bezel layer provided in addition to a transparent substrate for defining the transmission area TA, or may be defined by an ink layer inserted into or colored to the transparent substrate.

The display panel DP may include a display pixel PX for displaying images and a driver 50, and the display pixel PX is positioned in a display area DA and a component area EA. The display panel DP may include a front surface including a display area DA and a non-display area PA. The display area DA and the component area EA include pixels and display images, a touch sensor is positioned on upper sides of the display area DA and the component area EA in the third direction DR3 of the pixel, and the display area DA and the component area EA thus sense external inputs.

The transmission area TA of the cover window WU may at least partly overlap the display area DA of the display panel DP and the component area EA. For example, the transmission area TA may overlap the entire sides of the display area DA and the component area EA, or may overlap at least part of the display area DA and the component area EA. Hence, the user may see the images through the transmission area TA or may provide external inputs based on the images. However, the present disclosure is not limited thereto. For example, the region in which images are displayed may be separated from the region from which external inputs are sensed.

The non-display area PA of the display panel DP may at least partly overlap the blocking area BA of the cover window WU. The non-display area PA may be covered by the blocking area BA. The non-display area PA may be disposed near the display area DA, and may surround the display area DA. The non-display area PA displays no images, and a driving circuit for driving the display area DA or driving wires may be disposed therein. The non-display area PA may include a first peripheral area PA1 positioned outside the display area DA and a second peripheral area PA2 including a driver 50, connection wires, and a bending region. In the embodiments of FIG. 2, the first peripheral area PA1 is disposed on a third side of the display area DA, and the second peripheral area PA2 is disposed on another side of the display area DA.

The display panel DP may be assembled in a flat state so that the display area DA, the component area EA, and the non-display area PA may face the cover window WU. However, the present disclosure is not limited thereto. A portion (e.g., a predetermined portion) of the non-display area PA of the display panel DP may be bent. Part of the non-display area PA faces the rear surface of the display device 1000 so the blocking area BA seen on the front surface of the display device 1000 may be reduced, and in FIG. 2, the second peripheral area PA2 may be bent to be disposed on the rear surface of the display area DA and be assembled.

The component area EA of the display panel DP may include a first component region EA1 and a second component region EA2. The first component region EA1 and the second component region EA2 may be at least partly surrounded by the display area DA. The first component region EA1 and the second component region EA2 are shown to be spaced from each other, and without being limited thereto, at least part thereof may be connected to each other. The first component region EA1 and the second component region EA2 may represent regions below which optical elements or components (refer to ES of FIG. 2) are located, which use infrared rays, visible rays, or sound.

The display area DA (also referred to as a main display area) and the component area EA include a plurality of light emitting diodes LED, and a plurality of pixel circuits for generating light emitting currents and transmitting the same to the light emitting diodes LED. Here, one light emitting diode LED and one pixel circuit form (e.g., configure) a pixel PX. One pixel circuit and one light emitting diode LED may be formed in the display area DA and the component area EA.

The first component region EA1 may include a transmitting portion through which light or/and sound may transmit and a display unit including a plurality of pixels. The transmitting portion is disposed between adjacent pixels and is made of a layer for transmitting light or/and sound. The transmitting portion may be disposed between adjacent pixels, and a layer through which light does not transmit, such as a light blocking layer, may overlap the first component region EA1. The number of pixels (hereinafter, also referred to as resolution) per unit area of pixels (hereinafter referred to as normal pixels) included in the display area DA may correspond to the number of pixels per unit area of pixels (hereinafter, also referred to as first component pixels) included in first component region EA1.

The second component region EA2 includes a region (hereinafter, also referred to as a light transmitting region) made of a transparent layer to allow light to pass through, no conductive layer or semiconductor layer is disposed in the light transmitting region, and a layer including a light blocking material, for example, the pixel definition layer and/or the light blocking layer may include an opening overlapping a position that corresponds to the second component region EA2 to thus block no light. The number of pixels per unit area of pixels (also referred to as second component pixels) included in the second component region EA2 may be less than the number of pixels per unit area of normal pixels included in the display area DA. As a result, a resolution of the second component pixels may be lower than that of the normal pixels.

Figure 3:
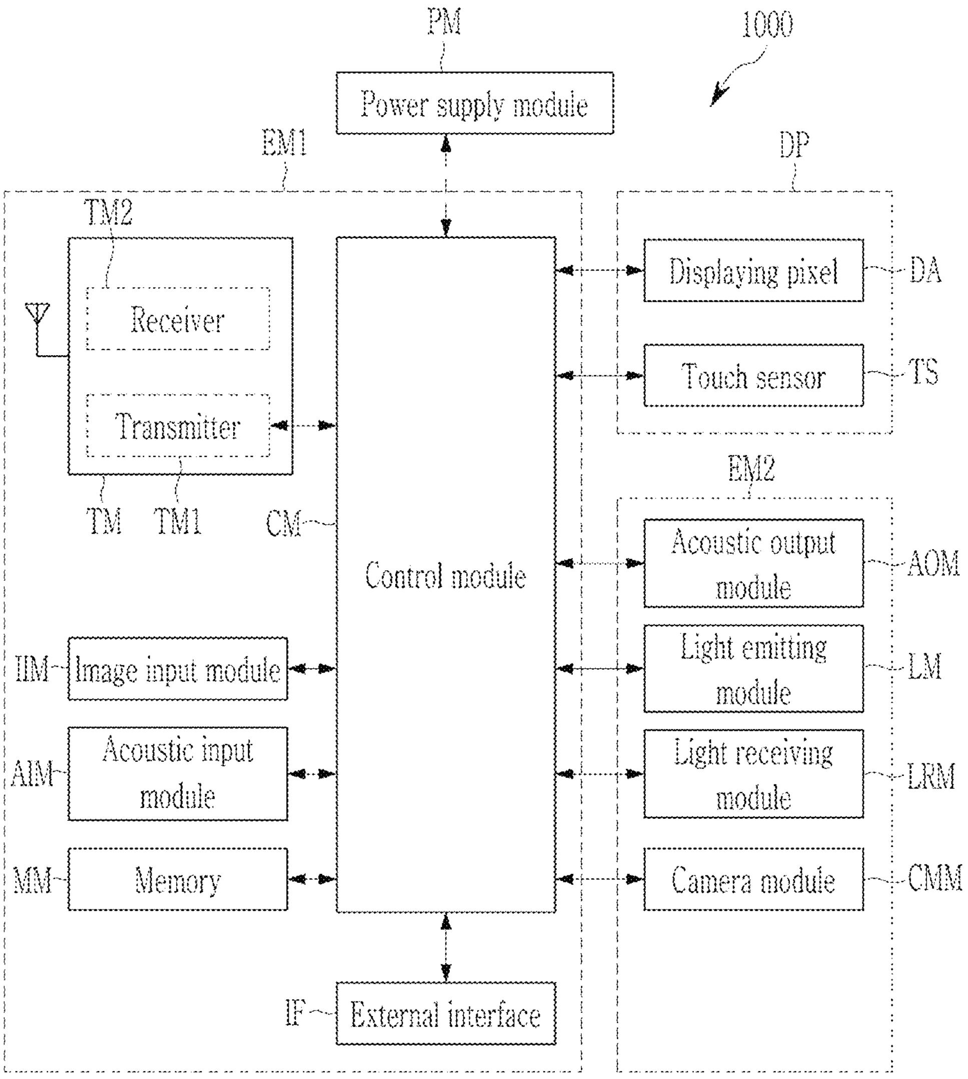
FIG. 3 shows a block diagram of a display device according to some embodiments of the present disclosure.

Referring to FIG. 3, the display panel DP may further include a touch sensor TS in addition to the display area DA including the display pixel PX. The display panel DP including the pixel PX for generating images may be visible to the user from the outside through the transmission area TA. Also, the touch sensor TS may be disposed on an upper portion of the pixel PX and may detect external inputs applied from the outside. The touch sensor TS may detect the external inputs provided to the cover window WU.

Referring to FIG. 2, the second peripheral area PA2 may include a bending portion. The display area DA and the first peripheral area PA1 may have a flat state substantially parallel to a plane defined by the first direction DR1 and the second direction DR2, and one side of the second peripheral area PA2 may extend from the flat state, may pass through the bending portion, and may have the flat state again As a result, at least part of the second peripheral area PA2 may be bent and be assembled to be disposed on the rear surface of the display area DA. Since at least the part of the second peripheral area PA2 overlaps the display area DA and in a plan view when assembled, the blocking area BA of the display device 1000 may be reduced. However, the present disclosure is not limited thereto. For example, the second peripheral area PA2 may not be bent (e.g., not be bendable).

The driver 50 may be mounted in the second peripheral area PA2, and may be mounted on the bending portion or may be disposed on either side of the bending portion. The driver 50 may be provided in the form of a chip (e.g., an integrated chip (IC)).

The driver 50 may be electrically connected to the display area DA and the component area EA and may transmit electrical signals to the pixels of the display area DA and the component area EA. For example, the driver 50 may provide data signals to the pixels PX disposed in the display area DA. In some examples, the driver 50 may include a touch driving circuit, and may be electrically connected to a touch sensor TS disposed in the display area DA and/or the component area EA. The driver 50 may include various circuits in addition to the above-described circuits or may be designed to provide various electrical signals to the display area DA.

In the display device 1000, a pad portion may be disposed at an end of the second peripheral area PA2, and may be electrically connected to a flexible printed circuit board (FPCB) including a driving chip by the pad portion. The driving chip disposed on the flexible printed circuit board may include various driving circuits for driving the display device 1000 or a connector for supplying a power voltage. In some examples, a rigid printed circuit board (PCB) may be used instead of the flexible printed circuit board.

The optical element ES may be disposed below the display panel DP. The optical element ES may include a first optical element ES1 overlapping the first component region EA1 and a second optical element ES2 overlapping the second component region EA2. The first optical element ES1 may use infrared rays, and in this case, a layer that does not transmit light, such as a light blocking layer, may overlap the first component region EA1, in the first component region EA1.

The first optical element ES1 may be an electronic element using light or sound. For example, the first optical element ES1 may be a sensor that receives and uses light like an infrared sensor, a sensor that outputs and senses light or sound to measure a distance or recognize fingerprints, or a small lamp that outputs light, or a speaker that outputs sound. In the case of electronic elements using light, it is possible to use light of various wavelength bands, such as visible light, infrared rays, and ultraviolet rays.

The second optical element ES2 may be at least one of a camera, an infrared camera (IR camera), a dot projector, an infrared illuminator, and a time-of-flight sensor (ToF sensor).

Referring to FIG. 3, the display device 1000 may include a display panel DP, a power supply module PM, a first electronic module EM1, and a second electronic module EM2. The display panel DP, the power supply module PM, the first electronic module EM1, and the second electronic module EM2 may be electrically connected to each other. FIG. 3 shows the display pixel and touch sensor TS disposed in the display area DA of the display panel DP, as an example.

The power supply module PM may supply a power voltage that is utilized for the overall operation of the display device 1000. The power supply module PM may include a battery module (e.g., a conventional battery module).

The first electronic module EM1 and the second electronic module EM2 may include various types of functional modules for operating the display device 1000. The first electronic module EM1 may be directly mounted on the mother board electrically connected to the display panel DP, or may be mounted on a separate substrate and may be electrically connected to the mother board through a connector.

The first electronic module EM1 may include a control module CM, a radio communication module TM, an image input module IIM, an acoustic input module AIM, a memory MM, and an external interface IF. Some of the modules may not be mounted on the mother board, but may be electrically connected to the mother board through a flexible printed circuit board connected thereto.

The control module CM may control the overall operation of the display device 1000. The control module CM may be a microprocessor. For example, the control module CM may activate or deactivate the display panel DP. The control module CM may control other modules such as the image input module IIM or the acoustic input module AIM based on the touch signal received from the display panel DP.

The radio communication module TM may transmit/receive radio signals to/from other terminals using Bluetooth or Wi-Fi lines. The radio communication module TM may transmit/receive voice signals using a general communication line. The radio communication module TM includes a transmitter TM1 for modulating signals and transmitting the same and a receiver TM2 for demodulating the received signals.

The image input module IIM may process image signals and may convert them into image data displayable to the display panel DP. The acoustic input module AIM may receive an external sound signal by a microphone in a recording mode or a voice recognition mode and may convert it into electrical voice data.

The external interface IF may serve as an interface connected to an external charger, a wired/wireless data port, a card socket (e.g., a memory card, a SIM/UIM card), etc.

The second electronic module EM2 may include an acoustic output module AOM, a light emitting module LM, a light receiving module LRM, and a camera module CMM, and at least some of which are referred to as optical elements ES and may be disposed on the rear surface of the display panel DP as shown in FIG. 1 and FIG. 2. The optical element ES may include a light emitting module LM, a light receiving module LRM, and a camera module (CMM). The second electronic module EM2 may be directly mounted on the mother board, may be mounted on a separate substrate and electrically connected to the display panel DP through a connector, or may be electrically connected to the first electronic module EM1.

The acoustic output module (AOM) may convert the acoustic data received from the radio communication module TM or the acoustic data stored in the memory MM, and may output the same to the outside.

The light emitting module LM may generate and output light. The light emitting module LM may output infrared rays. For example, the light emitting module LM may include an LED device. For example, the light receiving module LRM may detect infrared rays. The light receiving module LRM may be activated when infrared rays above a predetermined level are detected. The light receiving module LRM may include a CMOS sensor. When the infrared rays generated in the light emitting module LM are output, they are reflected by an external subject (e.g., the user's finger or face), and the reflected infrared rays may be incident on the light receiving module LRM. The camera module (CMM) may photograph external images.

In some embodiments, the optical element ES may additionally include an optical sensor or a heat sensor. The optical element ES may detect an external subject received through the front surface or may provide sound signals such as voice to the outside through the front surface. Also, the optical element ES may include a plurality of constituent elements, and is not limited to any one example.

Referring to FIG. 2, the housing HM may be combined with the cover window WU. The cover window WU may be disposed on the front surface of the housing HM. The housing HM may be combined with the cover window WU to provide an accommodation space. The display panel DP and the optical element ES may be received in the accommodation space provided between the housing HM and the cover window WU.

The housing HM may contain a material with relatively high rigidity. For example, the housing HM may include glass, plastic, and/or metal, or may include a plurality of frames and/or plates made of a combination thereof. The housing HM may protect (e.g., stably protect) the components of the display device 1000 accommodated in the internal space from external impacts.

A structure of the display device 1000 according to some embodiments will now be described with reference to FIG. 4.

Figure 4:
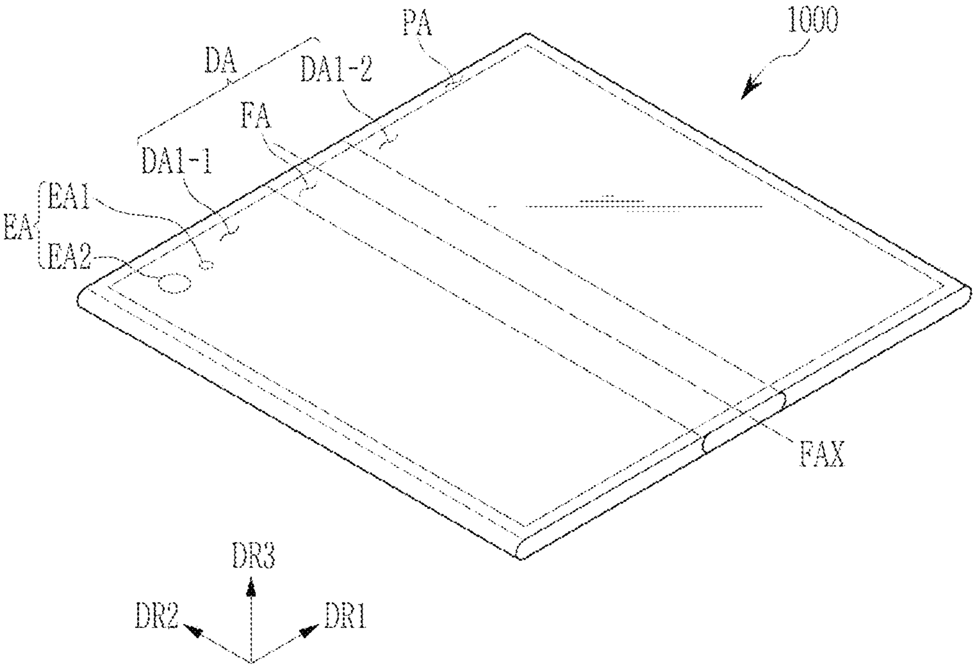
FIG. 4 shows a perspective view of a light emitting display device according to some other embodiments of the present disclosure.

FIG. 4 shows a perspective view of a light emitting display device according to some embodiments of the present disclosure.

Descriptions of the same configuration as the constituent elements described above will be omitted. FIG. 4 shows a foldable display device having a structure in which the display device 1000 is folded through a folding axis FAX.

Referring to FIG. 4, the display device 1000 may be a foldable display device in some embodiments. The display device 1000 may be folded outward or inward based on the folding axis FAX. When folded outward based on the folding axis FAX, the display surface of the display device 1000 may be disposed to the outside in the third direction DR3 respectively so that images may be displayed in both directions. When folded inward on the basis of the folding axis FAX, the display surface may not be visually recognized from the outside.

In some embodiments, the display device 1000 may include a display area DA, a component area EA, and a non-display area PA. The display area DA may be divided into a first-1 display area DA1-1, a first-2 display area DA1-2, and a folding area FA. The first-1 display area DA1-1 and the first-2 display area DA1-2 may be respectively disposed to the left and right of the folding axis FAX, and the folding area FA may be disposed between the first-1 display area DA1-1 and the first-2 display area DA1-2. At this time, when folded outward based on the folding axis FAX, the first-1 display area DA1-1 and the first-2 display area DA1-2 may be disposed on respective sides in the third direction DR3, and may both display images in a bi-directional manner. In addition, when folded inward with respect to the folding axis FAX, the first-1 display area DA1-1 and the first-2 display area DA1-2 may be invisible from the outside.

Figure 5:
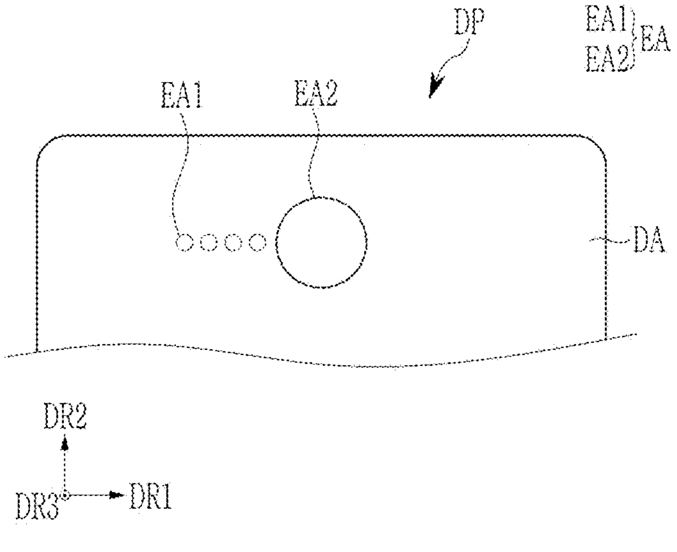
FIG. 5 shows a top plan view of a predetermined region of a light emitting display device according to some embodiments of the present disclosure.

FIG. 5 shows a top plan view of a region of a light emitting display device according to some embodiments of the present disclosure.

FIG. 5 shows a part of the light emitting display panel DP as part of a mobile phone according to some embodiments.

The display area DA is disposed on the front surface of the light emitting display panel DP, and the component area EA is disposed in the display area DA. In detail, the component area EA may include a first component region EA1 and a second component region EA2. Additionally, in the embodiments of FIG. 5, the first component region EA1 is disposed near the second component region EA2. In the embodiments of FIG. 5, the first component region EA1 is disposed to the left of the second component region EA2. The position and the number of the first component region EA1 may vary. In FIG. 5, the second optical element ES2 corresponding to the second component region EA2 may be a camera, and the first optical element ES1 corresponding to the first component region EA1 may be an optical sensor.

A plurality of light emitting diodes LED and a plurality of pixel circuits for generating light emitting currents and transmitting the same to the light emitting diodes LEDs are formed in the display area DA. Here, one light emitting diode LED and one pixel circuit form (e.g., configure) a pixel PX. In the display area DA, pixel circuits and corresponding light emitting diodes LEDs are formed. The display area DA is also referred to as a normal display area hereinafter. The display area DA may be disposed under the cutting-plane line.

The light emitting display panel DP according to some embodiments may be largely divided into a lower panel layer and an upper panel layer. The lower panel layer is the part where the light emitting diode and the pixel circuit constituting the pixel are disposed, and may include an encapsulation layer (refer to 400 in FIG. 6) covering the same. That is, the lower panel layer covering from the substrate (refer to 110 of FIG. 6) to the encapsulation layer includes an anode, a pixel defining layer (refer to 380 of FIG. 6), an emission layer (refer to EML of FIG. 6), a spacer (refer to 385 of FIG. 6), a functional layer (refer to FL of FIG. 6), and a cathode (refer to a cathode of FIG. 6), and includes an insulating layer between the substrate and the anode, a semiconductor layer, and a conductive layer. The upper panel layer is disposed on an upper portion of the encapsulation layer, and may include a sensing insulating layer for sensing touch (refer to 501, 510, and 511 of FIG. 6) and a plurality of sensing electrodes (refer to 540 and 541 of FIG. 6), and may include a light blocking layer (refer to 220 of FIG. 6), a color filter (see 230 of FIG. 6), and a planarization layer (refer to 550 of FIG. 6).

The first component region EA1 may be made of a transparent layer to allow light to pass through, and the conductive layer or the semiconductor layer may not be disposed thereon to allow light to pass through, and the first component region EA1 may not block light by allowing the lower panel layer to have a photosensor region, and forming an opening in a position that corresponds to the first component region EA1 on the pixel defining layer, the light blocking layer, and the color filter layer of the upper panel layer. When the photosensor region is disposed in the lower panel layer and there is no corresponding opening in the upper panel layer, it may be the display area DA and not the first component region EA1. One first component region EA1 may include a plurality of adjacent photosensor regions, and in this case, pixels adjacent to the photosensor region may be included in the first component region EA1. When the first optical element ES1 corresponding to the first component region EA1 uses infrared instead of visible rays, the first component region EA1 may overlap the light blocking layer 220 for blocking the visible rays.

The second component region EA2 may include a second component pixel and a light transmitting region, and a space between adjacent second component pixels may be the light transmitting region.

A peripheral area may be further disposed outside the display area DA. FIG. 5 shows a display panel of a mobile phone. However, the optical element may be located on the rear surface of the display panel, for example, in the case of a flexible display device. In the case of a foldable display device, the positions of the second component region EA2 and the first component region EA1 may be formed at different positions from FIG. 5.

A structure of the light emitting display panel DP according to some embodiments will now be described with reference to FIG. 6.

Figure 6:
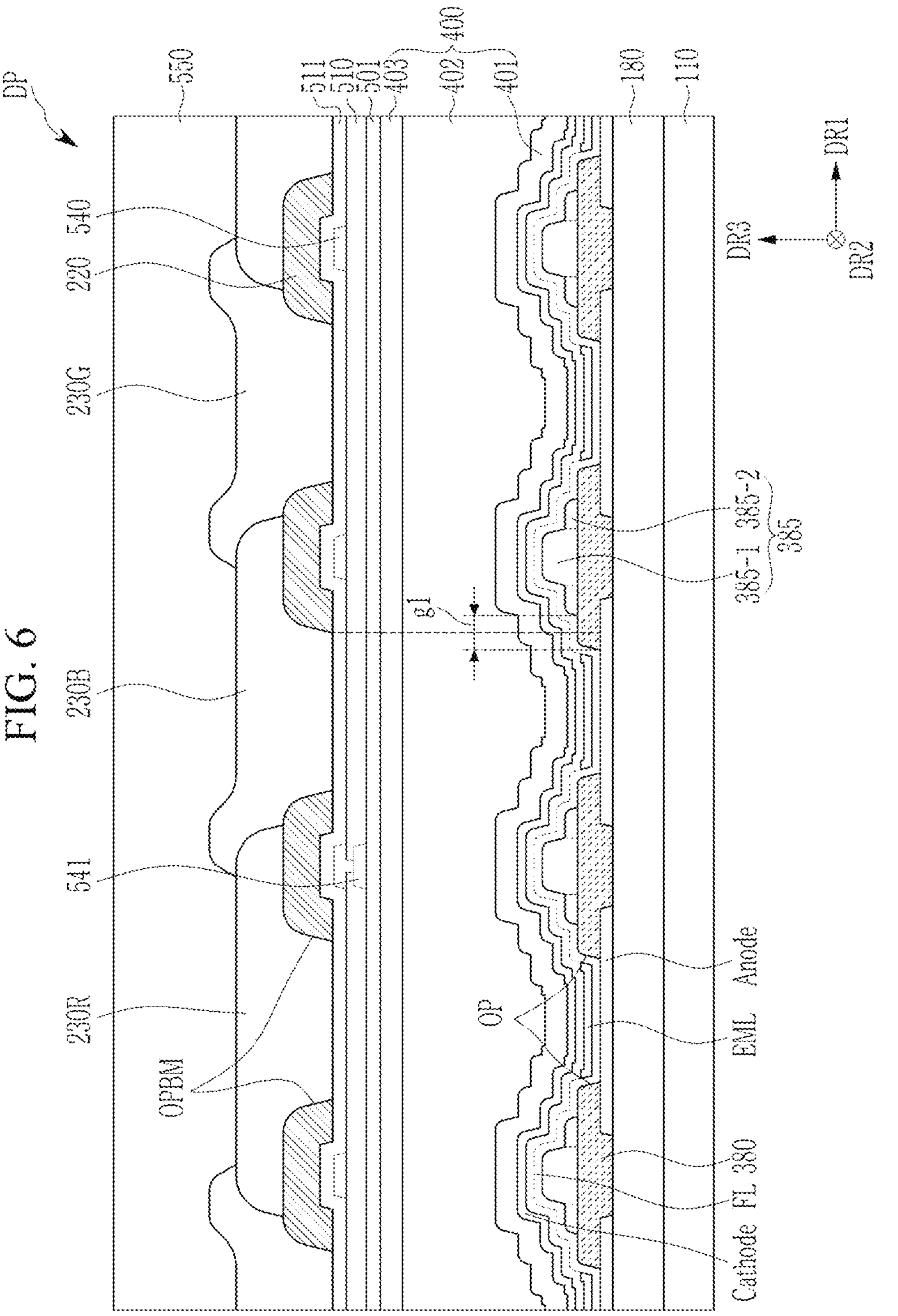
FIG. 6 shows a cross-sectional view of a display panel according to some embodiments of the present disclosure.

FIG. 6 shows a cross-sectional view of a display panel according to some embodiments of the present disclosure.

The light emitting display panel DP according to some embodiments may display images by forming a light emitting diode on the substrate 110, may detect touches by including sensing electrodes 540 and 541, and may allow light emitted from the light emitting diode to have color characteristics of the color filters 230R, 230G, and 230B by including a light blocking layer 220 and color filter 230R, 230G, and 230B.

A polarizer is not formed on the front surface of the light emitting display panel DP according to some embodiments, but the pixel defining layer 380 is formed with a black organic material, and a light blocking layer 220 and a color filter 230 are formed on the upper portion so, when external light enters the inside, it may be reflected from the anode and may not be transmitted to the user.

The light emitting display panel DP according to some embodiments will now be described in detail.

The substrate 110 may include a material that does not bend due to rigid characteristics such as glass, or may include a flexible material that may bend such as plastic or polyimide.

A plurality of thin film transistors are formed on the substrate 110 and the organic film 180 covering the thin film transistor is shown. One pixel is formed with a pixel circuit in which a light emitting diode, a plurality of transistors for transmitting light emitting currents to the light emitting diode, and capacitors are formed. FIG. 6 shows no pixel circuit, and the structure of the pixel circuit may vary. FIG. 6 shows the organic film 180 covering the pixel circuit.

The light emitting diode including an anode, an emission layer EML, and a cathode is disposed on the organic film 180.

The anode may be made of a single layer including a transparent conductive oxide film and a metal material or a multilayer including the same. The transparent conductive oxide film may include an indium tin oxide (ITO), a poly-ITO, an indium zinc oxide (IZO), an indium gallium zinc oxide (IGZO), and an indium tin zinc oxide (ITZO), and the metal material may include silver (Ag), molybdenum (Mo), copper (Cu), gold (Au), and aluminum (Al).

The emission layer EML may be formed of an organic light emitting material, and adjacent emission layers EML may display different colors. The respective emission layers EML may display light of the same color because of the color filters 230R, 230G, and 230B disposed on the upper portion. The emission layer EML may have a structure in which emission layers are stacked (also referred to as a tandem structure).

The pixel defining layer 380 is disposed on the organic film 180 and the anode, the pixel defining layer 380 has an opening OP, the opening overlaps part of the anode, and the emission layer EML is disposed on the anode exposed by the opening OP. The emission layer EML may be disposed in the opening OP of the pixel defining layer 380, and is separated from the adjacent emission layer EML by the pixel defining layer 380.

The pixel defining layer 380 may be made of a black organic material in a negative type. The black organic material may include a light blocking material, and the light blocking material may include a resin or a paste including carbon black, carbon nanotubes, and black dye, and metal particles, for example, nickel, aluminum, molybdenum, and alloys thereof, and a metal oxide particle (e.g., a chromium nitride). The pixel defining layer 380 includes a light-blocking material to have a black color, and may have a characteristic of absorbing/blocking light without reflecting the same. Since the organic material in a negative type is used, it may have the characteristic of removing a portion covered by the mask.

A spacer 385 is formed on the pixel defining layer 380. The spacer 385 includes a first portion 385-1 disposed in a tall and narrow region and a second portion 385-2 disposed in a low and wide region. FIG. 6 shows that the first portion 385-1 and the second portion 385-2 are separated through a dotted line in the spacer 385. Here, the first portion 385-1 may serve to secure rigidity against a pressing pressure by enhancing scratch strength. The second portion 385-2 may serve as a contact aid between the pixel defining layer 380 and the upper functional layer FL. The first portion 385-1 and the second portion 385-2 are made of the same material and may be made of a positive type photosensitive organic material, for example, a photosensitive polyimide (PSPI) may be used. Since it has a positive characteristic, the part not covered by the mask may be removed. The spacer 385 has transparency so that light may be transmitted and/or reflected.

The pixel defining layer 380 may be formed in a negative type, and the spacer 385 may be formed in a positive type, and they may include the same material in some examples.

At least one portion of the upper surface of the pixel defining layer 380 is covered by the spacer 385, and an edge of the second portion 385-2 is spaced apart from an edge of the pixel defining layer 380 so that part of the pixel defining layer 380 is not covered by the spacer 385. The second portion 385-2 may cover the upper surface of the pixel defining layer 380, on which the first portion 385-1 is not disposed, and may increase an adhesion characteristic between the pixel defining layer 380 and the functional layer FL. In some embodiments, the spacer 385 is disposed in the region overlapping the light blocking layer 220 to be described later in a plan view, so that the spacer 385 may be covered by the light blocking layer 220 and may be invisible when viewed from the front surface of the display panel DP.

The functional layer FL is disposed on the spacer 385 and the exposed pixel defining layer 380, and the functional layer FL may be formed on the front surface of the light emitting display panel DP or in a set or predetermined region, for example, it may be formed in all regions except the light transmitting region of the second component region EA2. The functional layer FL may include an electron injection layer, an electron transport layer, a hole transport layer, and a hole injection layer, and may be disposed above and below the emission layer EML. That is, the hole injection layer, the hole transport layer, the emission layer EML, the electron transport layer, the electron injection layer, and the cathode may be sequentially disposed on the anode, and the hole injection layer and hole transport layer of the functional layer FL may be disposed below the emission layer EML, and the electron transport layer and the electron injection layer may be disposed on the emission layer EML.

The spacer 385 may increase scratch strength on the light emitting display panel DP to reduce a rate of defects caused by the pressing pressure, and in some examples, it may increase the adherence with the functional layer FL disposed on an upper portion of the spacer 385 to prevent moisture and air from being injected from the outside or substantially reduce instances thereof. In addition, high adherence has the merit of eliminating the problem of interlayer adherence falling when the light emitting display panel DP has a flexible characteristic and folds and unfolds.

The cathode may be made of a light-transmitting electrode or a reflecting electrode. In some examples, the cathode may be a transparent or semi-transparent electrode, and may be made to be a metal thin film with a small work function including lithium (Li), calcium (Ca), fluorinated lithium/calcium (LiF/Ca), fluorinated lithium/aluminum (LiF/Al), aluminum (Al), silver (Ag), magnesium (Mg), and their compounds. A transparent conductive oxide (TCO) such as an indium tin oxide (ITO), an indium zinc oxide (IZO), a zinc oxide (ZnO), an indium oxide ($In_2O_3$), and/or the like may be further disposed on the metal thin film. The cathode may be integrally formed over the front surface of the light emitting display panel DP.

An encapsulation layer 400 is disposed on the cathode. The encapsulation layer 400 includes at least one inorganic film and at least one organic film, and FIG. 6 shows a triple layer structure including a first inorganic encapsulation layer 401, an organic encapsulation layer 402, and a second inorganic encapsulation layer 403. The encapsulation layer 400 may protect the emission layer EML made of an organic material from moisture or oxygen that may inflow from the outside. In some examples, the encapsulation layer 400 may include a structure in which an inorganic layer and an organic layer are sequentially further stacked.

Sensing insulating layers 501, 510, and 511 and sensing electrodes 540 and 541 are disposed on the encapsulation layer 400 so as to sense touches. In the embodiments of FIG. 6, the touch (e.g., user touch) is sensed in a capacitive type using two sensing electrodes 540 and 541, but In some examples, the touch may be sensed in a self-cap method using one sensing electrode. The sensing electrodes 540 and 541 may be insulated with the second sensing insulating layer 510 interposed therebetween, the lower sensing electrode 541 may be disposed on the first sensing insulating layer 501, the upper sensing electrode 540 may be disposed on the second sensing insulating layer 510, and the upper sensing electrode 540 may be covered by the third sensing insulating layer 511. The sensing electrodes 540 and 541 may be electrically connected through an opening disposed in the second sensing insulating layer 510. Here, the sensing electrodes 540 and 541 may include a metal such as aluminum (Al), copper (Cu), silver (Ag), gold (Au), molybdenum (Mo), titanium (Ti), or tantalum (Ta), or metal alloys thereof, and may be made of a single layer or a multilayer structure.

A light blocking layer 220 and color filters 230R, 230G, and 230B are disposed on the third sensing insulating layer 511.

The light blocking layer 220 may be disposed to overlap the sensing electrodes 540 and 541 in a plan view, and may be disposed not to overlap the anode in a plan view. This is to prevent the anode and the emission layer EML for displaying images from being covered by the light blocking layer 220 and the sensing electrodes 540 and 541.

Referring to FIG. 6, the light blocking layer 220 is disposed in the region overlapping the pixel defining layer 380 in a plan view, and one side of the light blocking layer 220 comes inward from the corresponding one side of the pixel defining layer 380.

The light blocking layer 220 has an opening OPBM, and an area of the opening OPBM of the light blocking layer 220 is greater than the opening OP of the pixel defining layer 380, and regarding the opening OP of the pixel defining layer 380 in a plan view, the light blocking layer 220 may be disposed in the opening OPBM.

One side of the spacer 385 is disposed from the corresponding side of the pixel defining layer 380 by a predetermined interval g-1, and the spacer 385 comes inward from one side of the light blocking layer 220. As a result, when viewed from the front surface of the display panel DP, the spacer 385 may be covered by the light blocking layer 220 and may be invisible.

When external light is input, it may pass through the opening OPBM of the light blocking layer 220 and may then be reflected from the side wall of the opening OPBM of the pixel defining layer 380. The side wall of the opening OP of the pixel defining layer 380 has a curved surface, and color separation occurs according to the reflected disposition, so the color of the reflected light may be seen in various colors similar to a rainbow. Since such color-separated reflected light may be easily visible to the user's eyes and displaying quality may be deteriorated, in some embodiments of the present disclosure, the opening OPBM of the light blocking layer 220 and the opening OP of the pixel defining layer 380 are respectively formed in an oval shape, and the direction of the oval shape or the eccentricity of the oval shape is variously arranged to reduce color separation or allow the reflected white light to be visible as, for example, in the embodiments of FIG. 7. This will now be described in further detail with reference to FIG. 7.

Color filter 230R, 230G, and 230B are disposed on the sensing insulating layers 501, 510, and 511 and the light blocking layer 220. The color filters 230R, 230G, and 230B include a red color filter 230R for transmitting red light, a green color filter 230G for transmitting green light, and a blue color filter 230B for transmitting blue light. The respective color filters 230R, 230G, and 230B may be disposed to overlap the anode of the light emitting diode LED in a plan view. As the light emitted from the emission layer EML may pass through a color filter to be changed to a corresponding color and may then be emitted, all lights emitted from the emission layer EML may have the same color. However, the emission layer EML may display light of different colors, and may allow the light to pass through a color filter of the same color to reinforce the displayed color.

The light blocking layer 220 may be disposed between the respective color filters 230R, 230G, and 230B. In some examples, the color filters 230R, 230G, and 230B may be replaced with color conversion layers or may further include color conversion layers. The color conversion layers may include quantum dots.

A planarization layer 550 for covering the color filters 230R, 230G, and 230B are disposed on the color filters 230R, 230G, and 230B. The planarization layer 550 may planarize the upper surface of the light emitting display panel, and may be a transparent organic insulator including at least one material selected from among a polyimide, a polyamide, an acryl resin, benzocyclobutene, a phenol resin, and/or the like.

In some examples, a low refraction layer and an additional planarization layer may be further disposed on the planarization layer 550 to improve front visibility and light emission efficiency of the display panel. Light may be emitted while being refracted to the front surface by the low refractive layer and an additional planarization layer having high refractive characteristics. In this case, the planarization layer 550 may be omitted and the low refraction layer and the additional planarization layer may be disposed on the color filter 230.

In the present embodiment, no polarizer is included on the planarization layer 550. That is, the polarizer may prevent or substantially reduce display deterioration while the user recognizes external light as it is input and reflected on the anode or the side wall of the opening OP of the pixel defining layer 380. However, the polarizer not only reduces the reflection of external light, but also reduces the light emitted from the emission layer EML, so there is a drawback that more power is consumed to display predetermined luminance. To reduce power consumption, the light emitting display device according to the present embodiment may include no polarizer.

In some embodiments, the side of the anode is covered with a pixel defining layer 380 to reduce the degree of reflection from the anode, and the light blocking layer 220 is formed to reduce the degree of light input and prevent or substantially reduce the degradation of displaying quality due to reflection. Therefore, it is not necessary to separately form the polarizer on the front surface of the light emitting display panel DP.

Embodiments for forming an oval opening OPBM of the light blocking layer 220 and an oval opening OP of the pixel defining layer 380 through a structure of the light emitting display panel DP formed in the display area DA will now be further described with reference to FIGS. 7 to 9.

Figure 7:
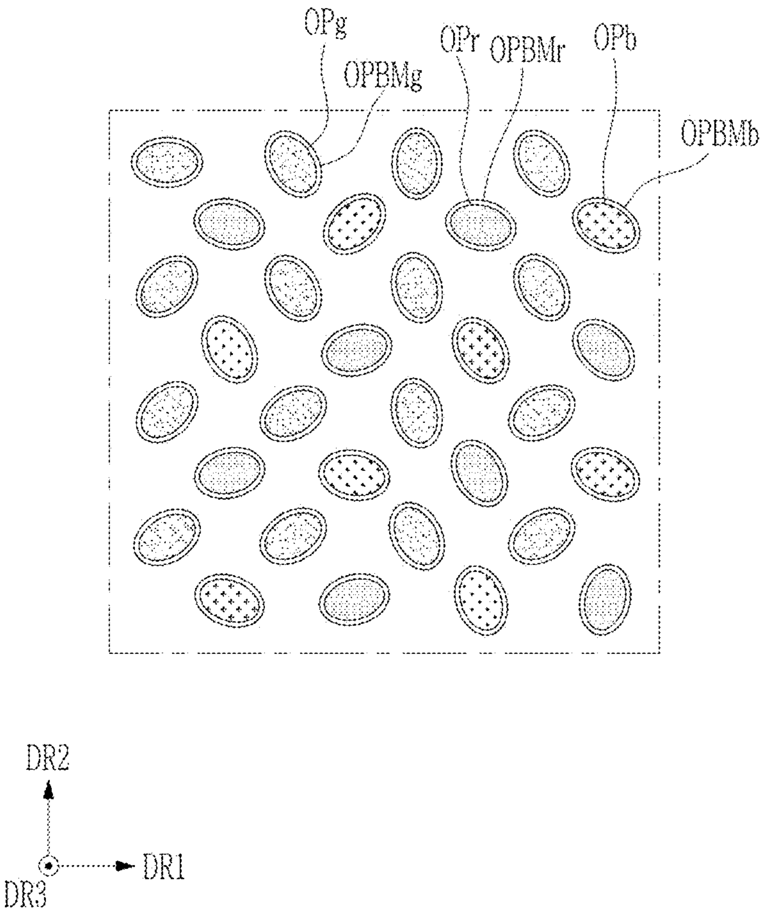
FIG. 7 to FIG. 9 show top plan views of a portion of a display panel according to some embodiments of the present disclosure.
Figure 8:
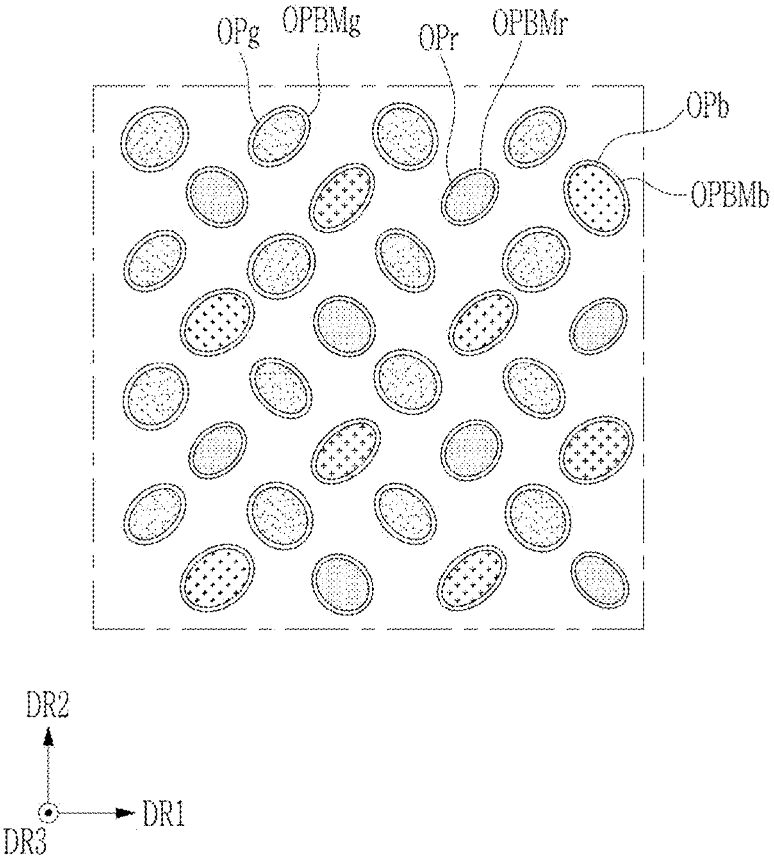
Figure 9:
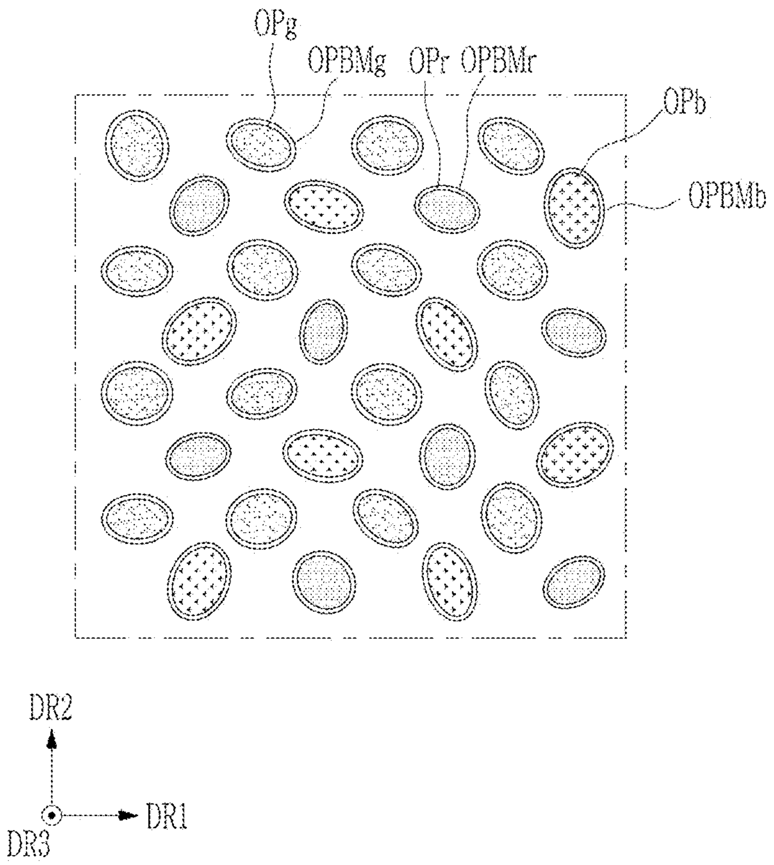

FIGS. 7 to 9 show top plan views of a portion of a display panel according to some embodiments of the present disclosure.

FIG. 7 shows that openings OPBM of the light blocking layer 220 and openings OP of a pixel defining layer 380 are disposed at various angles according to some embodiments. FIG. 8 shows that openings OPBM of the light blocking layer 220 and openings OP of the pixel defining layer 380 are disposed with various degrees of eccentricity according to some embodiments. FIG. 9 shows that openings OPBM of the light blocking layer 220 and openings OP of the pixel defining layer 380 are disposed at various angles and with various degrees of eccentricity according to some embodiments. Referring to FIGS. 7 to 9, with respect to the emission layers displaying the three primary colors of red, green, and blue, the openings OP of the pixel defining layers 380 and the openings OPBM of the light blocking layer 220 corresponding to the respective emission layers are divided into openings OPr, OPg, and OPb and openings OPBMr, OPBMg, and OPBMb. Here, r, g, and b may correspond to red, green, and blue, respectively.

A planar structure of the openings OPr, OPg, and OPb of the pixel defining layer 380 and the openings OPBMr, OPBMg, and OPBMb of the light blocking layer 220 will now be described in detail with reference to FIG. 7.

The openings OPr, OPg, and OPb of the pixel defining layer 380 and the openings OPBMr, OPBMg, and OPBMb of the light blocking layer 220 respectively have an oval flat shape with the same eccentricity. That is, the red opening OPr, the green opening OPg, and the blue opening OPb of the pixel defining layer 380 may all be ovals having the same eccentricity. The red opening OPBMr, the green opening OPBMg, and the blue opening OPBMb of the light blocking layer 220 may all be oval in shape having the same eccentricity. Here, the eccentricity of the openings OPr, OPg, and OPb of the pixel defining layer 380 and the openings OPBMr, OPBMg, and OPBMb of the light blocking layer 220 may have a value of 0.2 to 0.85.

Here, the oval shape (e.g., elliptical shape) may have two focal points, may have a shape in which points with a sum of the distances to the two focal points is constant are connected, and may have a long axis and a short axis. On the other hand, the eccentricity of an oval is a value obtained by dividing the distance between the two focal points by a length of the long axis. When the eccentricity is 0, it is a circle, and when it is 1, it forms a parabola, so the oval has an eccentricity value that is greater than 0 and less than 1. Thus, as used herein, the term "eccentricity" of the opening refers to how flat or round the shape of the opening is. The more flattened the ellipse is, the greater the value of its eccentricity. The more circular, the smaller the value or closer to zero is the eccentricity.

The openings OPr, OPg, and OPb of one pixel defining layer 380 correspond to the openings OPBMr, OPBMg, and OPBMb of one light blocking layer 220. That is, openings OPr, OPg, and OPb of the pixel defining layer 380 corresponding to the openings OPBMr, OPBMg, and OPBMb of the light blocking layer 220 are disposed in the respective openings OPBMr, OPBMg, and OPBMb of the light blocking layer 220. The openings OPBMr, OPBMg, and OPBMb of the corresponding light blocking layer 220 and the openings OPr, OPg, and OPb of the pixel defining layer 380 may overlap each other in a plan view and may have a constant horizontal gap, and the openings OPBMr, OPBMg, and OPBMb of the two correspond light blocking layers 220 and the openings OPr, OPg, and OPb of the pixel defining layer 380 may have oval-shaped long-axis directions at the same angle. Here, the horizontal gap between the openings OPBMr, OPBMg, and OPBMb of the light blocking layer 220 and the corresponding openings OPr, OPg, and OPb of the pixel defining layer 380 may be 4.5 μm to 10 μm, and the horizontal gap may be changeable according to a thickness of the layer (e.g., the encapsulation layer) between the two in a cross-sectional view, and the encapsulation layer may have the thickness of about 6 μm. In some examples, the long-axis direction of the openings OPBMr, OPBMg, and OPBMb of the corresponding light blocking layer 220 and the openings OPr, OPg, and OPb of the pixel defining layer 380 may form a set or predetermined angle because of processing errors. In some examples, it may have an angle of 0 to 10 degrees.

In the embodiments of FIG. 7, the respective long axes of the openings OPr, OPg, and OPb of the pixel defining layer 380 may have five or more different angles (e.g., with respect to the first direction), and the angles of less than or equal to 36 degrees formed by the long axes may be disposed as intervals.

For example, a detailed angle relationship centering on some embodiments having five angles will be given as follows. In the embodiments with 5 angles, the angles of the long axes are formed at intervals by about 36 degrees, and when one long axis has 0 degrees with respect to the first direction DR1, other angles may be 36 degrees, 72 degrees, 108 degrees, and 144 degrees. In other words, the five angles may find the interval between the angles of the long axes by dividing the angle of 180 degrees by the number of different long-axis directions, that is, 5.

The angles formed by the respective long axes of the openings OPBMr, OPBMg, and OPBMb of the light blocking layer 220 may have five or more angles, and the angles of less than or equal to 36 degrees formed by the long axes may be disposed as intervals.

As described above, the angle formed by the long axes of the openings OPr, OPg, and OPb of the pixel defining layer 380 or the openings OPBMr, OPBMg, and OPBMb of the light blocking layer 220 may be disposed at regular intervals at a specific angle of 36 degrees or less. However, the angle formed by the long axes of the respective openings may be disposed at irregular intervals at one of the angles that are less than or equal to 36 degrees. In some embodiments, the long axes of the openings are disposed at irregular intervals intentionally to reduce a diffraction pattern, or may be arranged at irregular intervals because of processing errors.

In order for a unit pixel including red, green, and blue openings to have a square structure, it may be appropriate to divide the angle of the long axis into a number that corresponds to the square of an integer, for example 22, 32, 42, and 52. Here, the unit pixel may include one red opening, one green opening, and one blue opening, and one colored opening among them, for example, the green opening may be formed to be multiple.

When the openings OPr, OPg, and OPb of the pixel defining layer 380 or the openings OPBMr, OPBMg, and OPBMb of the light blocking layer 220 have five or more angles (at angle intervals of 36 degrees or less), color separation of external light is reduced or a predetermined diffraction pattern or a color separation is generated regardless of the angles, which will be described later in detail with reference to FIG. 13 and FIG. 14.

FIG. 8 shows some embodiments in which openings OPBMr, OPBMg, and OPBMb of the light blocking layer 220 and openings OPr, OPg, and OPb of the pixel defining layer 380 are formed in an oval shape of two or more different eccentricities. Each opening of the same color may be formed into an oval shape with two or more eccentricities. Here, referring to FIG. 16, the eccentricity of the oval shape may have a range of 0.2 to 0.85.

Referring to FIG. 8, the long-axis direction of the oval may have two directions forming 45 degrees with respect to the first direction DR1 or the second direction DR2, and it may have up to 5 directions unlike FIG. 7.

Structures of the openings OPr, OPg, and OPb of the pixel defining layer 380 and the openings OPBMr, OPBMg, and OPBMb of the light blocking layer 220 in a plan view will now be described in further detail with reference to FIG. 8.

Referring to FIG. 8, the openings OPr, OPg, and OPb of the pixel defining layer 380 and the openings OPBMr, OPBMg, and OPBMb of the light blocking layer 220 have an oval flat shape, and the long-axis direction of the oval is arranged in two directions that forms 45 degrees with respect to the first direction DR1 or the second direction DR2.

The red opening OPr, the green opening OPg, and the blue opening OPb of the pixel defining layer 380 may be respectively formed as an oval having at least two different eccentricities. The red opening OPBMr, the green opening OPBMg, and the blue opening OPBMb of the light blocking layer 220 may be respectively formed as an oval having at least two different eccentricities. In the examples of FIG. 8, the openings of the pixel defining layer 380 with the same color may have an oval flat shape with at least two different eccentricities from among the openings OPr, OPg, and OPb, and the openings of the light blocking layer 220 with the same color may have an oval flat shape with at least two different eccentricities from among the openings OPBMr, OPBMg, and OPBMb.

The openings OPr, OPg, and OPb of one pixel defining layer 380 correspond to the openings OPBMr, OPBMg, and OPBMb of one light blocking layer 220. That is, the openings OPr, OPg, and OPb of the pixel defining layer 380 corresponding to the openings OPBMr, OPBMg, and OPBMb of the light blocking layer 220 are disposed in the openings OPBMr, OPBMg, and OPBMb of the light blocking layer 220. The openings OPBMr, OPBMg, and OPBMb of the corresponding light blocking layer 220 and the openings OPr, OPg, and OPb of the pixel defining layer 380 may overlap each other in a plan view, may have a constant horizontal gap, and the oval long-axis directions may be formed at the same angle as each other. Here, the horizontal gap between the openings OPBMr, OPBMg, and OPBMb of the light blocking layer 220 and the corresponding openings OPr, OPg, and OPb of the pixel defining layer 380 may be about 4.5 μm to about 10 μm, and the horizontal gap may be changed according to the thickness of the layer (e.g., the encapsulation layer) disposed between the two in a cross-sectional view. In some examples, the long-axis direction of the openings OPBMr, OPBMg, and OPBMb of the corresponding light blocking layer 220 and the openings OPr, OPg, and OPb of the pixel defining layer 380 may form a set or predetermined angle because of processing errors, and may have the angle of about 0 degrees to about 10 degrees.

The openings with the same color but in two or more oval shapes with different eccentricities may be disposed in various positions with various ratios according to some embodiments of FIG. 8. In some examples, the oval shapes having different eccentricity may be included with equal numbers in the display area, or they may be included with different numbers. For example, when the red openings OPr of the pixel defining layer 380 are formed with two oval shapes having different eccentricities, the corresponding red openings OPBMr of the light blocking layer 220 may also have different eccentricities. However, in some examples, the red opening OPBMr of the light blocking layer 220 may be formed with the same eccentricity.

Referring to FIG. 8, the angle formed by the respective long axes of the openings OPr, OPg, and OPb of the pixel defining layer 380 or the openings OPBMr, OPBMg, and OPBMb of the light blocking layer 220 is 45 degrees with respect to the first direction DR1 and the second direction DR2. In some embodiments where the eccentricity of the oval is formed in various ways, unlike the examples of FIG. 7, the number of angles formed by the long axes of the oval shapes may be formed to be five or less. That is, in the embodiments of FIG. 8, various oval shapes with different eccentricity are formed in order to cause less color separation of external light or to generate a constant diffraction pattern or color separation regardless of the angle. Therefore, the embodiments of FIG. 8 allows a constant color separation and/or constant diffraction in a different way from the embodiments of FIG. 7 of varying the long-axis direction of the oval.

Figure 11A:
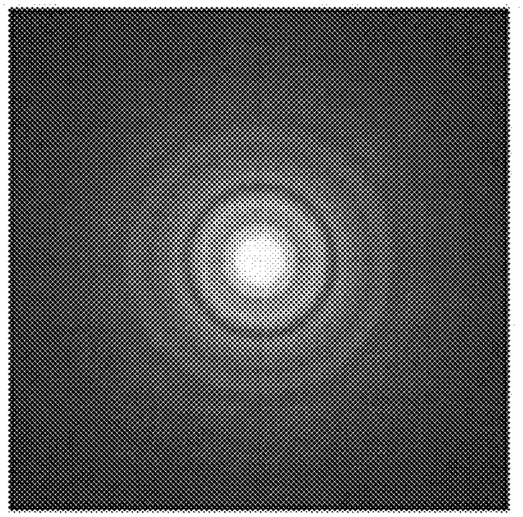
FIGS. 11A to 11D show photographs of reflection characteristics according to a comparative example and the embodiments of FIGS. 7 to 9.
Figure 11B:
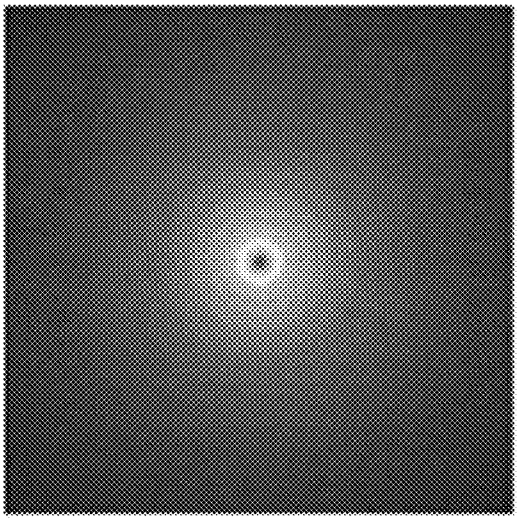
Figure 11C:
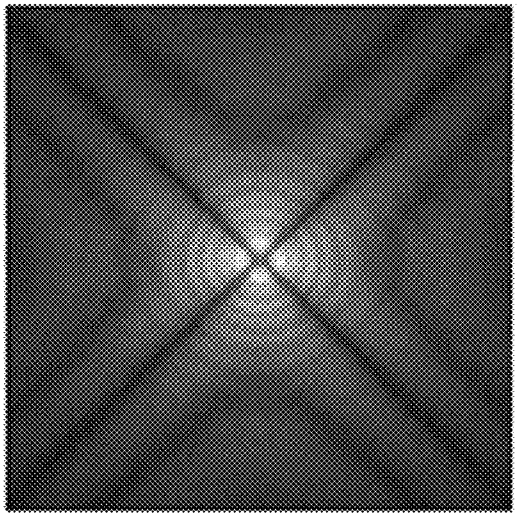

In the embodiments of FIG. 8, as the number of the ovals in the long-axis direction is small thus generating a reflecting diffraction pattern such as that shown in FIG. 11C, one of the openings OPr, OPg, and OPb of the pixel defining layer 380 or the openings OPBMr, OPBMg, and OPBMb of the light blocking layer 220 may be formed to be circular, or the number of the oval shapes in the long-axis direction is increased to thus reduce the directionality of the diffraction pattern.

Embodiments of FIG. 9, which represent a merger of the embodiments of FIG. 7 and the embodiments of FIG. 8, will now be described.

Figure 16:
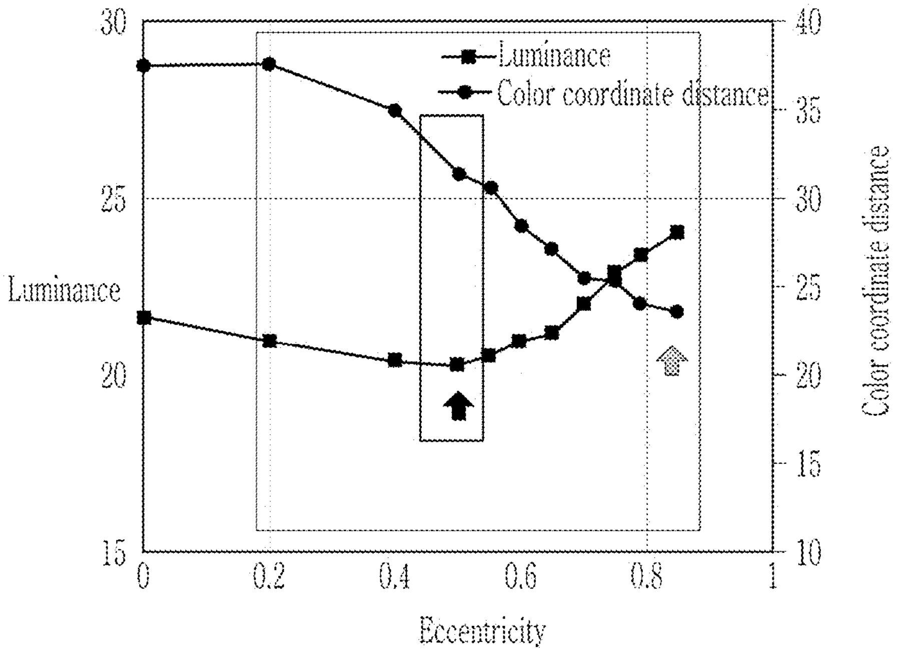

Referring to FIG. 9, the openings OPBMr, OPBMg, and OPBMb of the light blocking layer 220 and the openings OPr, OPg, and OPb of the pixel defining layer 380 are formed in oval shapes with different eccentricities for the same color, and the respective long axes of the openings OPBMr, OPBMg, and OPBMb of the light blocking layer 220 and the openings OPr, OPg, and OPb of the pixel defining layer openings of 380 may have five or more angles with angle intervals less than or equal to 36 degrees. Referring to FIG. 16, the eccentricity of the oval shapes of FIG. 9 may have a range of about 0.2 to about 0.85.

The embodiments of FIG. 9 include all the features of the embodiments of FIG. 7 and the embodiments of FIG. 8 so the openings OPr, OPg, and OPb of the pixel defining layer 380 or the openings OPBMr, OPBMg, and OPBMb of the light blocking layer 220 may have 5 or more angles with angle intervals of 36 degrees or less, and in addition, various eccentricities of the oval are formed to generate less color separation of external light or a constant diffraction pattern or a color separation is generated regardless of the angle. In some examples, the long-axis directions of the openings OPr, OPg, and OPb of the pixel defining layer 380 or the openings OPBMr, OPBMg, and OPBMb of the light blocking layer 220 may be formed at regular intervals or at irregular intervals.

Table 1 below illustrates a comparison of the embodiments of FIGS. 7 to 9.

TABLE 1

| | Embodiment of FIG. 7 | Embodiment of FIG. 8 | Embodiment of FIG. 9 |
|---|---|---|---|
| Pixel defining layer opening oval eccentricity | Red, green, blue the same eccentricity | Two or more eccentricities; Eccentricities that are different for different colors; Eccentricities with different openings with the same color (The circle with the eccentricity of 0 is possible) | Two or more eccentricities; Eccentricities that are different for different colors; Eccentricities with different openings with the same color(The circle with the eccentricity of 0 is possible) |
| Pixel defining layer opening area (aperture ratio) | The same | Areas are different for different eccentricities | Areas are different for different eccentricities |
| Disposition ratio | Regular disposition | The total number of ovals with different eccentricities are the same or different | The total number of ovals with different eccentricities are the same or different |
| Pixel defining layer opening oval long-axis angle | Five or more different angles | The total of two angles of 45 degrees(Angles of five or less are possible) | May be disposed at five or more different angles |
| Light blocking layer opening oval shape | Offset from pixel defining layer opening by predetermined distance and then formed | Offset from pixel defining layer opening by predetermined distance and then formed | Offset from pixel defining layer opening by predetermined distance and then formed |

To examine the characteristics of the embodiments described above, a comparative example of FIG. 10 will now be described, and diffraction characteristics and chromatic dispersion characteristics of reflected light between a comparative example and some embodiments will now be described with reference to FIG. 11.

Figure 10:
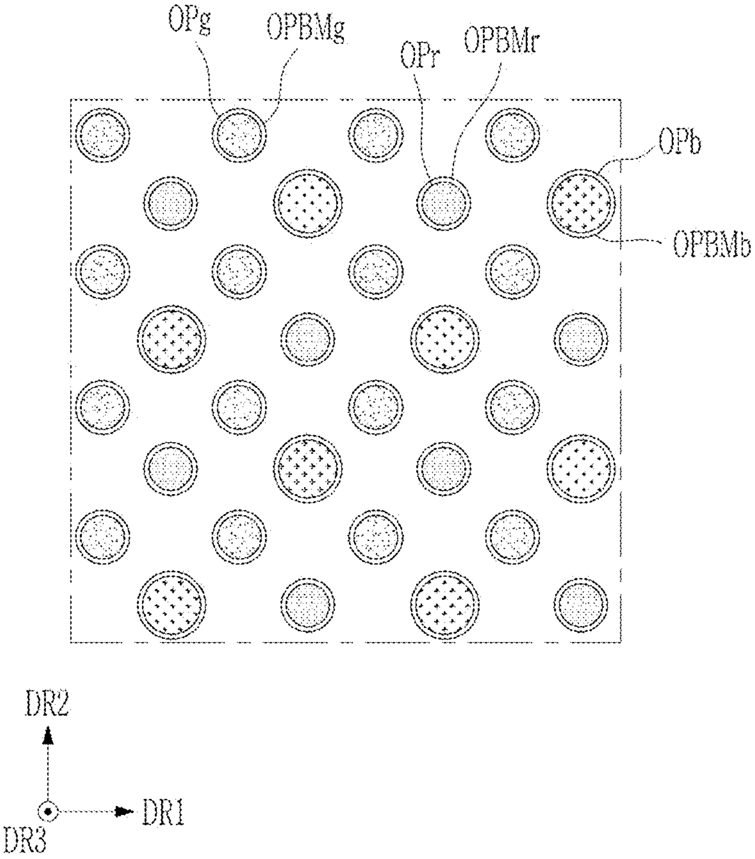
FIG. 10 shows a top plan view of a portion of a display panel according to a comparative example.

FIG. 10 shows a top plan view of a portion of a display panel according to a comparative example, and FIG. 11 shows a photograph of a reflection characteristic according to a comparative example and some embodiments of FIG. 7 to FIG. 9.

Differing from some embodiments of FIG. 7 to FIG. 9, the comparative example of FIG. 10 shows that the openings OPBMr, OPBMg, and OPBMb of the light blocking layer 220 and the openings OPr, OPg, and OPb of the pixel defining layer 380 are respectively formed to have a circular shape.

Figure 11D:
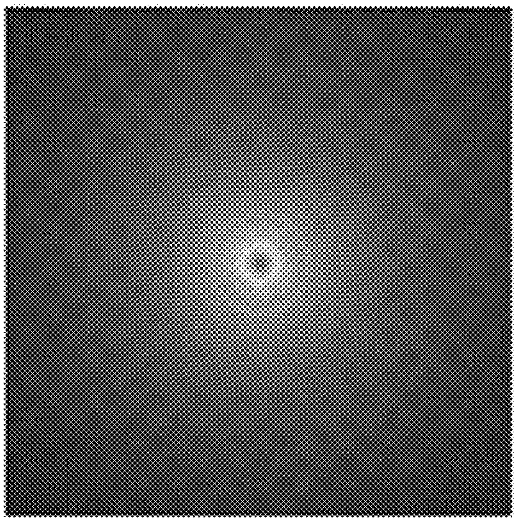

FIG. 11 shows diffraction patterns and color dispersions of the reflected light for the embodiment of FIG. 7 to FIG. 9 and the comparative example of FIG. 10, and in detail, FIG. 11A pertains to the comparative example of FIG. 10, FIG. 11(B) pertains to the embodiments of FIG. 7, FIG. 11C pertains to the embodiments of FIG. 8, and FIG. 11D pertains to the embodiment of FIG. 9.

Regarding the comparative example of FIG. 11A, the diffraction pattern is formed in a ring shape and the diffraction pattern has no relationship to the angle, but there are a plurality of rings, and the respective rings display different colors thus showing that the reflected light is color-separated.

On the contrary, referring to FIG. 11B and FIG. 11D, it is found that the diffraction pattern has no directionality so it has an angle-independent diffraction pattern, and the ring shape is not visually recognized but is seen as white overall, so that no specific color separation occurs.

FIG. 11C shows that the diffraction pattern has a linear pattern with the angle of 45 degrees, and a diffraction pattern is formed with respect to the angle, which is caused by orienting (e.g., arranging) the long-axis angle of the oval at 45 degrees, so the angle-dependent diffraction characteristic may be reduced by forming some openings in a circular shape or increasing the long-axis direction of the oval shapes.

Diffraction characteristics according to the long-axis angle will now be described with reference to FIG. 12 to FIG. 14.

A relationship between the long-axis angle of the oval and the direction of the diffraction pattern of the reflected light will now be described with reference to FIG. 12.

FIGS. 12A-12D shows reflection characteristics of a light emitting display device with respect to different angles (e.g., different long-axis angles of the openings).

Figure 12A:
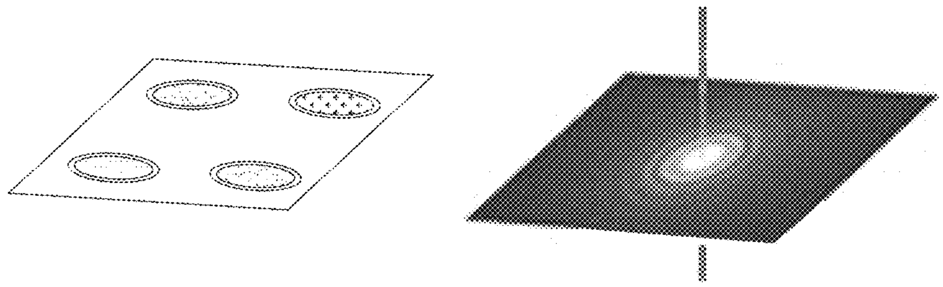
FIGS. 12A-12D show reflection characteristics of a light emitting display device with respect to different opening long-axis angles.
Figure 12B:
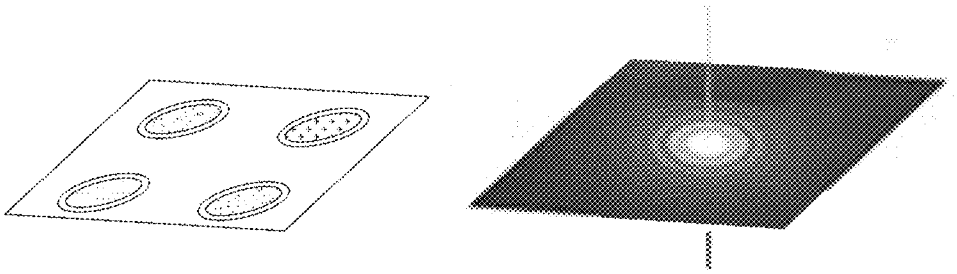
Figure 12C:
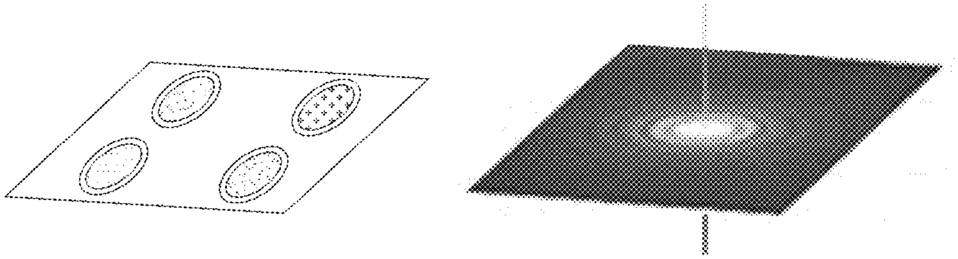

Referring to FIGS. 12A, 12B, and 12C, the opening of the pixel defining layer 380 and the opening of the light blocking layer 220 are arranged in the same direction on the left side of the drawing, and the corresponding diffraction pattern of the reflected light is shown on the right side of the drawing.

Referring to FIGS. 12A-12D, when the opening of the pixel defining layer 380 and the opening of the light blocking layer 220 have an oval shape, it is found that the diffraction pattern of the reflected light is also formed in an oval shape but the long-axis directions are different. Referring to FIGS. 12A and 12C, the long-axis direction of the opening of the pixel defining layer 380 and the opening of the light blocking layer 220 and the long-axis direction of the oval pattern of the diffraction pattern of the reflected light may be perpendicular to each other.

Figure 12D:
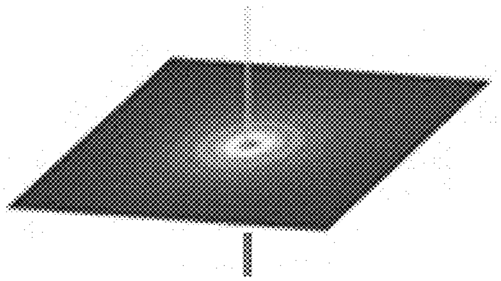

When the diffraction patterns of FIGS. 12A, 12B, and 12C on the are combined, they may become a circular diffraction pattern and may have an angle-independent diffraction pattern as shown in FIG. 12D.

Hereafter, it will be described how many oval structures arranged at various angles are utilized to form a diffraction pattern that is independent of angles with reference to FIGS. 13A-13C and FIGS. 14A-14C.

Figure 13A:
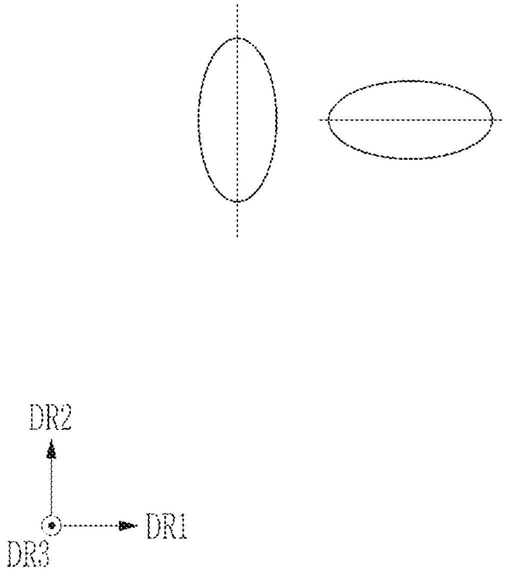
FIGS. 13A-13C show various arrangements of opening long-axis angles according to some embodiments of the present disclosure.
Figure 13B:
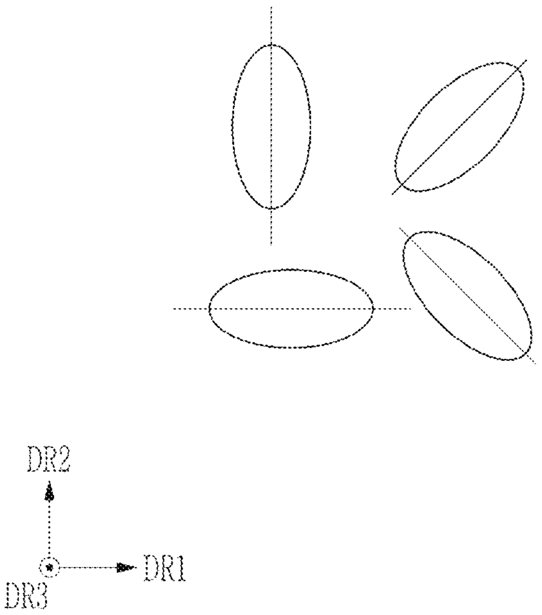
Figure 13C:
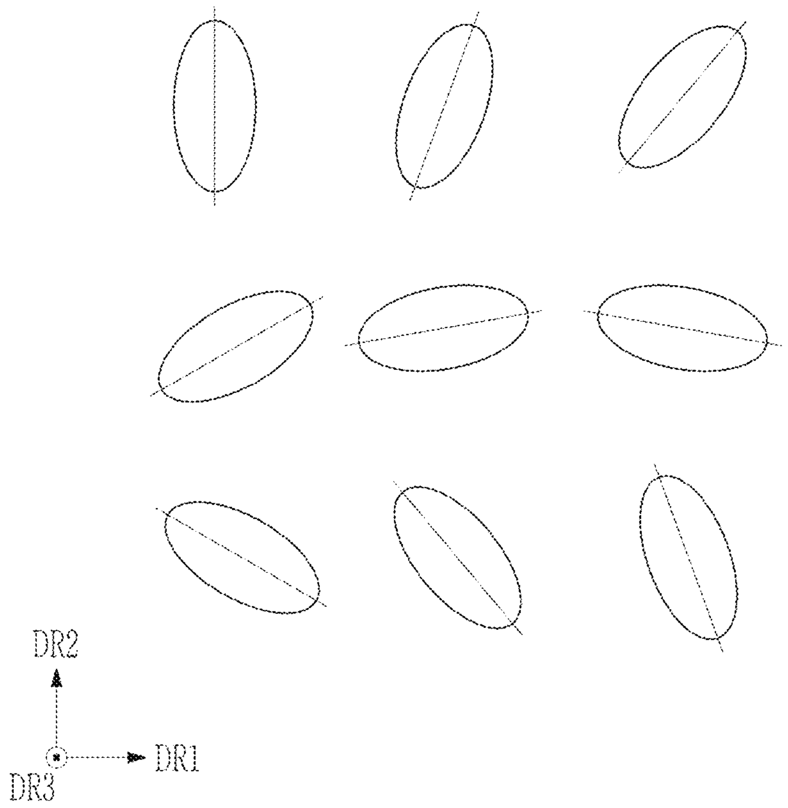
Figure 14A:
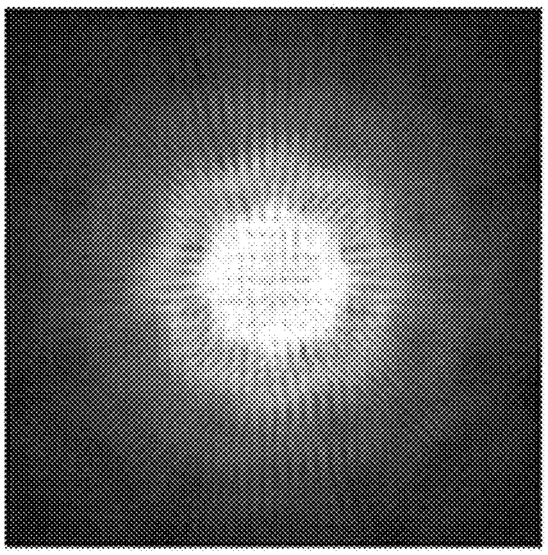
FIGS. 14A-14E show photographs of reflection characteristics with respect to different opening long-axis angles according to some embodiments of the present disclosure.
Figure 14B:
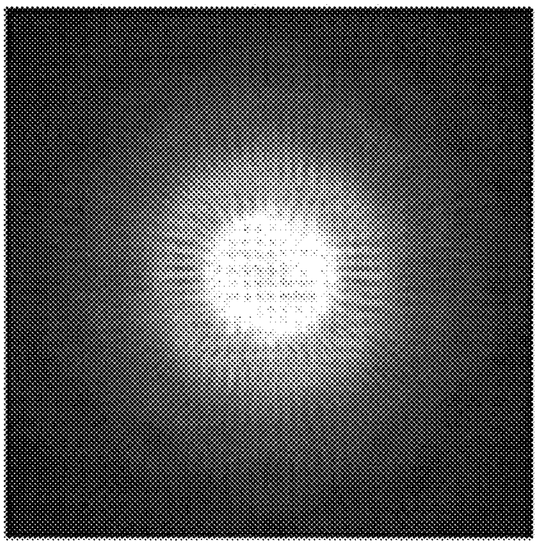
Figure 14C:
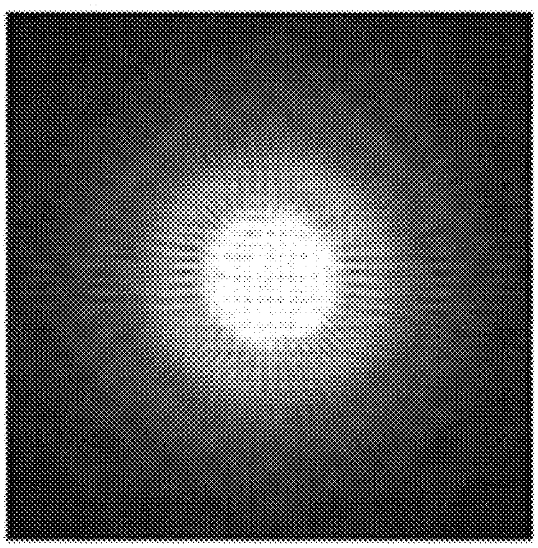

FIGS. 13A-13C show various arrangements of angles according to some embodiments of the present disclosure; and FIGS. 14A-14C show a photograph of a reflection characteristic with respect to these angles, according to some embodiments of the present disclosure.

FIGS. 13A-13C show the long-axis directions of a set of ovals that may be formed in one display area.

FIG. 13A shows some embodiments in which the openings OP of the pixel defining layer 380 and/or the openings OPBM of the light blocking layer 220 have two long-axis directions, and the two long-axis directions are arranged at angle intervals of 90 degrees.

FIG. 13B shows some embodiments in which the openings OP of the pixel defining layer 380 and/or the openings OPBM of the light blocking layer 220 have four long-axis directions, and the four long-axis directions are arranged at angle intervals of 45 degrees.

FIG. 13C shows some embodiments in which the openings OP of the pixel defining layer 380 and/or the openings OPBM of the light blocking layer 220 has nine long-axis directions, and the nine long-axis directions are arranged at angle intervals of 20 degrees.

In addition to the long-axis direction shown in FIGS. 13A-13C, it may be formed with various long-axis directions arranged at various angles as intervals, and when the number of the long-axis directions is small, the diffraction patterns become different according to the angle as shown in FIG. 11C, so they may include more than a predetermined number of long-axis angles.

As an illustration, FIGS. 14A-14E show diffraction patterns according to the number of different long-axis directions.

Figure 14D:
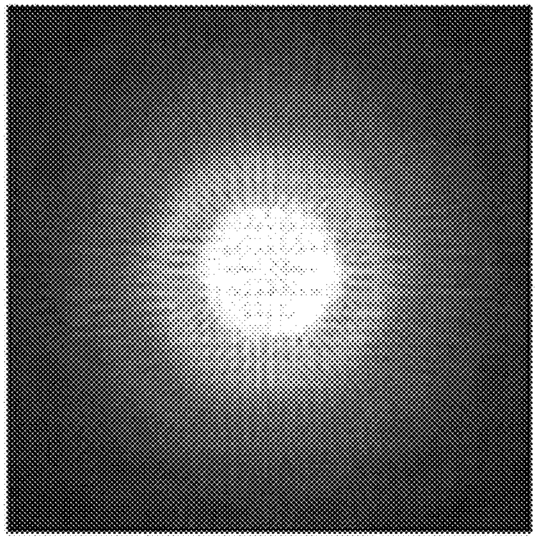
Figure 14E:
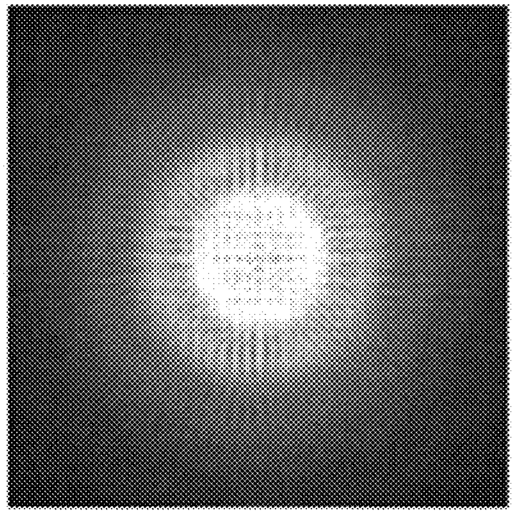

FIG. 14(A) shows a diffraction pattern of some embodiments having four different long-axis angles as in FIG. 13(B), FIG. 14(B) shows a diffraction pattern of some embodiments having five different long-axis angles, FIG. 14(C) shows a diffraction pattern of some embodiments having six different long-axis angles, FIG. 14(D) shows a diffraction pattern of some embodiments having seven different long-axis angles, and FIG. 14(E) shows a diffraction pattern of some embodiments having eight different long-axis angles.

To have a diffraction pattern independent of directions in FIG. 14, it is appropriate to have a diffraction pattern that is close to a circular shape, and it is shown in FIG. 14A that it has a protruding shape and there is a difference in the diffraction characteristic and the color separation depending on the direction. FIG. 14B to FIG. 14E have a circular diffraction pattern and have a direction-independent diffraction characteristic and exhibit color separation. Therefore, based on FIGS. 14A-14E, when the opening OP of the pixel defining layer 380 and/or the opening OPBM of the light blocking layer 220 is formed to have five or more different long-axis angles, a constant diffraction pattern or a color separation occurs regardless of the angle, resulting in improved display quality. Here, in embodiments having five different long-axis angles, the long-axis angles are disposed at the intervals of 36 degrees. Therefore, in embodiments with five or more long-axis angles, the long-axis angles may be disposed at the intervals of angles that are 36 degrees or less.

Changes of the reflection characteristics according to the change of the eccentricity of the oval will now be described with reference to FIG. 15 and FIG. 16.

Figure 15:
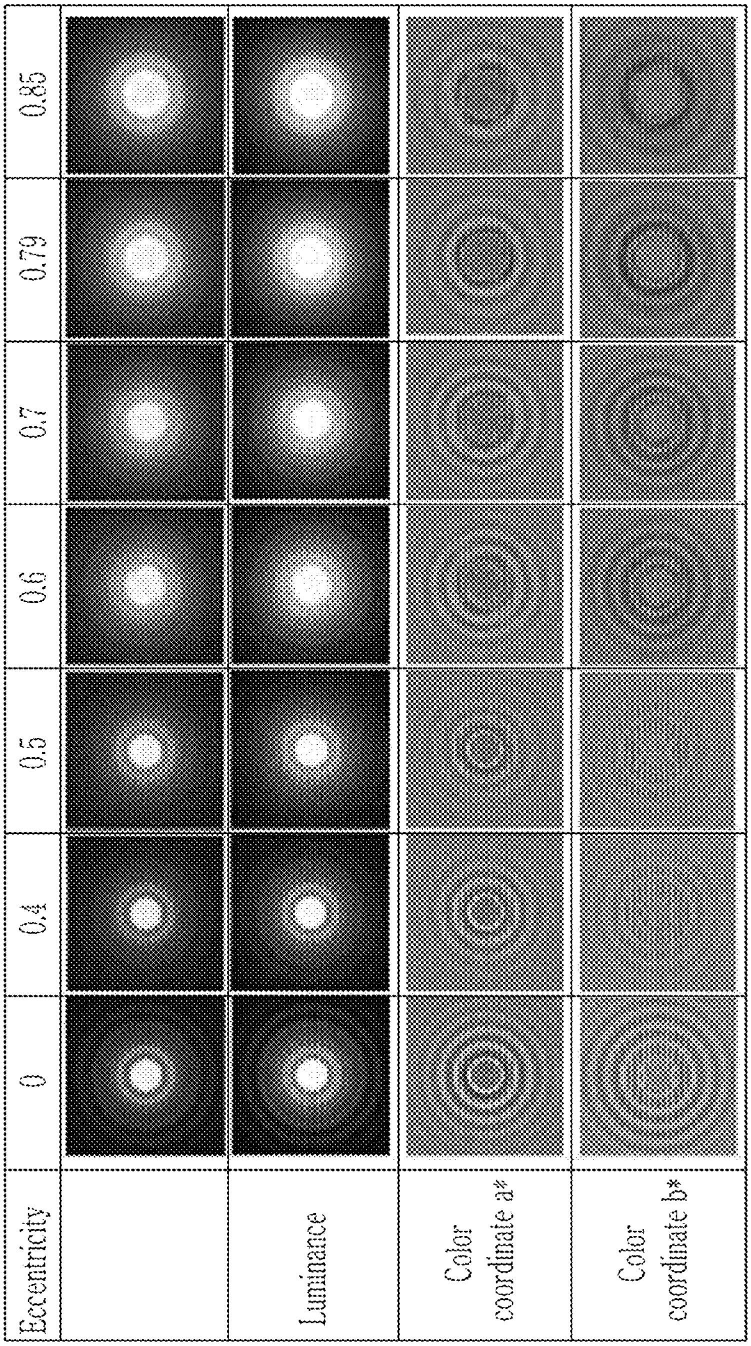
FIG. 15 and FIG. 16 show reflection characteristics with respect to eccentricity of the openings, according to some embodiments of the present disclosure.

FIG. 15 and FIG. 16 show reflection characteristics with respect to eccentricity.

FIG. 15 shows respective extraction of luminance distribution for a color diffraction pattern of reflected light according to a value of eccentricity and a distribution on two axes of a color coordinate, and based on this, FIG. 16 shows a graph of standard deviation values of luminance and distance values on color coordinates with respect to eccentricity.

Referring to FIG. 15 and FIG. 16, the smaller the luminance distribution and the distance value on color coordinates are, the weaker the diffraction is perceived. Referring to FIG. 16, a position where the luminance distribution or the distance value on the color coordinates is the smallest is indicated by an arrow. Referring to FIG. 15 and FIG. 16, when the eccentricity is 0.5, it has the smallest luminance distribution value, and when considering the color coordinate distribution, it may be confirmed that it is the best example of those shown. Referring to FIG. 16, in the region where eccentricity is partitioned by dotted lines, that is, in the range of 0.2 to 0.85, it is determined that the luminance distribution and the color coordinate distribution do not significantly deteriorate the display quality so the oval shape of eccentricity with this range may be applied.

The opening OP of the pixel defining layer 380 or the opening OPBM of the light blocking layer 220 has been described centering on embodiments having one (or the same) eccentricity.

In some examples, at least two oval shapes having different eccentricities may be merged to form the opening OP of the pixel defining layer 380 or the opening OPBM of the light blocking layer 220, which will now be described with reference to FIGS. 17A-17D to FIG. 19.

A basic oval shape and the arrangement of openings based on it will now be described with reference to FIGS. 17A-17D and FIG. 18.

FIGS. 17A-17D and FIG. 18 show structures of merging ovals with different eccentricities.

Referring to FIGS. 17A-17D, as an example of merging two or more oval shapes with different eccentricities, the embodiment of merging two different oval shapes will now be described in detail.

Figure 17A:
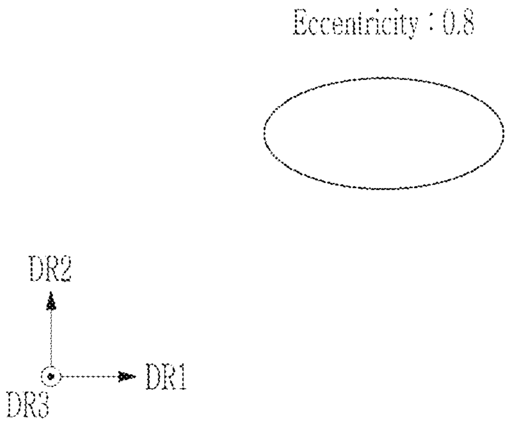
FIGS. 17A-17D and FIG. 18 show a structure of merging oval shapes with different eccentricities, according to some embodiments of the present disclosure.
Figure 17B:
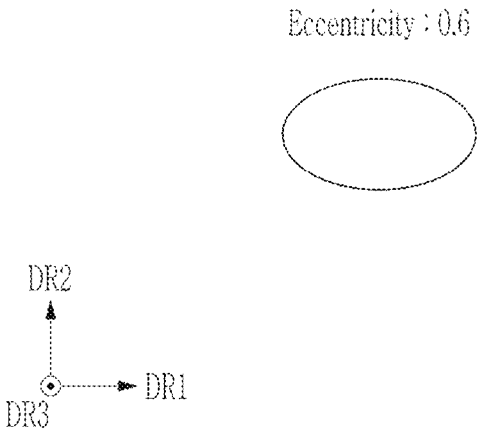
Figure 17C:
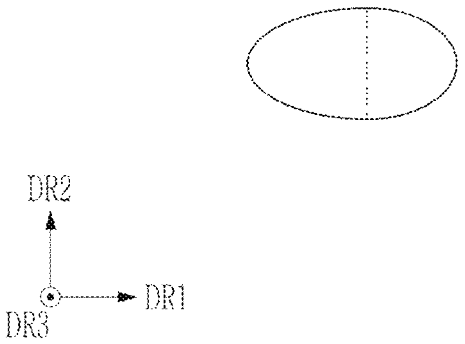
Figure 17D:
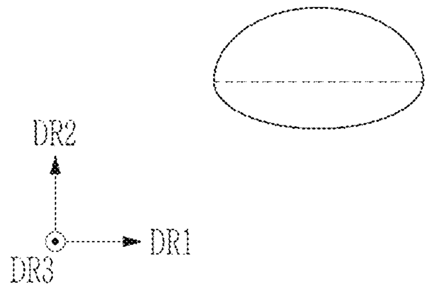

FIG. 17A and FIG. 17B show oval shapes with different eccentricities, and FIG. 17C and FIG. 17D show ovals obtained by merging two oval shapes with different eccentricities in different ways.

FIG. 17A shows an oval with the eccentricity of 0.8, and FIG. 17B shows an oval shape with the eccentricity of 0.6. The oval that merges these two ovals may have the shape shown in FIG. 17C or FIG. 17D.

FIG. 17C and FIG. 17D show a dotted line in the merged oval shape, and the ovals on both sides of the dotted line are parts of the ovals with different eccentricities.

That is, FIG. 17C shows an example of cutting an oval of FIG. 17A and FIG. 17B in the second direction DR2 and combining them, and FIG. 17D shows an example of cutting an oval of FIG. 17A and FIG. 17B in the first direction DR1 and combining them. The method of combining two ovals having different eccentricities is not limited thereto, and may be combined in various ways.

Figure 18:
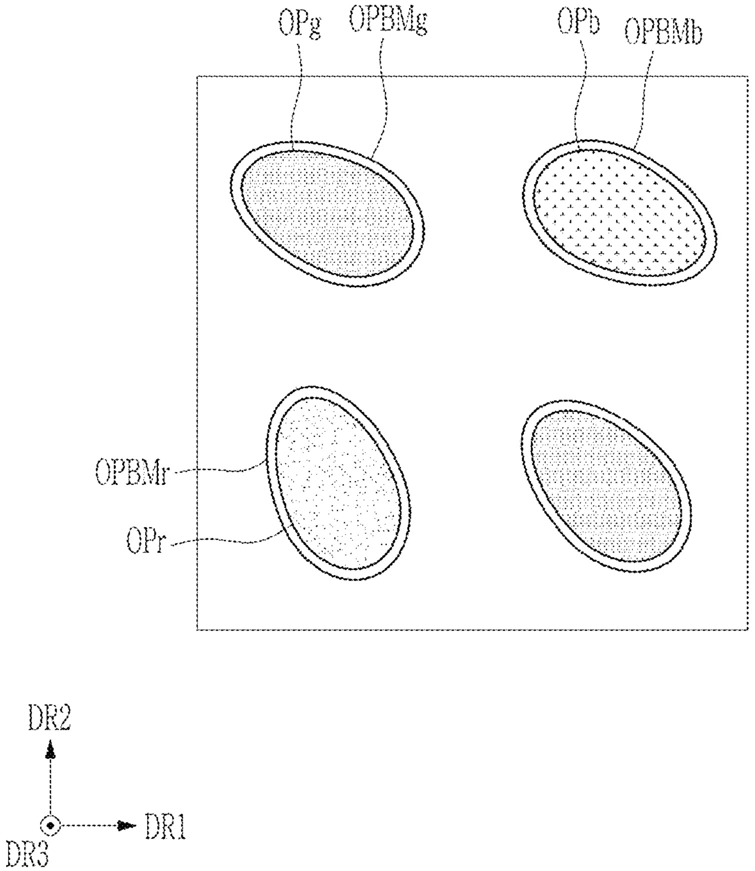

An example of arranging the openings OPBMr, OPBMg, and OPBMg, and OPBMb of light blocking layer 220 and the openings OPr, OPg, and OPb of pixel defining layer 380 in various long-axis directions using the oval shapes merged in the same way as in FIG. 17C is shown in FIG. 18.

One unit pixel is shown in the embodiment of FIG. 18, and one unit pixel includes one red openings OPr and OPBMr, one blue openings OPb and OPBMb, and two green openings OPg and OPBMg.

In the embodiments of FIG. 18, the long-axis directions of the respective openings OPr, OPg, and OPb of the pixel defining layer 380 may be different from each other, and the long-axis directions of the respective openings OPBMr, OPBMg, and OPBMb of the light blocking layer 220 may also be different from each other.

Regarding the embodiment using an oval that is a combination of two ovals with different eccentricities shown in FIG. 18, as described with reference to FIGS. 14A-14E, the respective long axes of the openings OPr, OPg, and OPb of the pixel defining layer 380 and the openings OPBMr, OPBMg, and OPBMb of the light blocking layer 220 may have five or more different angles formed at intervals of 36 degrees or less.

Also, since the eccentricities of the two ovals used for merging may vary, the size of the merged ovals may also vary. In addition, in some embodiments, two ovals with different eccentricity may be combined with each color, and various ovals may be formed by combining two ovals with different eccentricity when they are of the same color.

Here, the openings OPr, OPg, and OPb of the pixel defining layer 380 and/or the openings OPBMr, OPBMg, and OPBMb of the light blocking layer 220 may have the eccentricity of 0.2 to 0.85 as shown in FIG. 15 and FIG. 16.

The long-axis directions of the openings OPr, OPg, and OPb of the pixel defining layer 380 and the corresponding openings OPBMr, OPBMg, and OPBMb of the light blocking layer 220 may be the same or may have an angle of less than or equal to 10 degrees because of processing errors.

The openings OPr, OPg, and OPb of the pixel defining layer 380 and the corresponding openings OPBMr, OPBMg, and OPBMb of the light blocking layer 220 may have a set or predetermined interval in a plan view or may have a horizontal gap of 4.5 μm to 10 μm.

Diffraction characteristics of reflected light according to some embodiments (FIG. 19A) using an oval shape merged in the same way as in FIG. 17C will now be described.

Figure 19A:
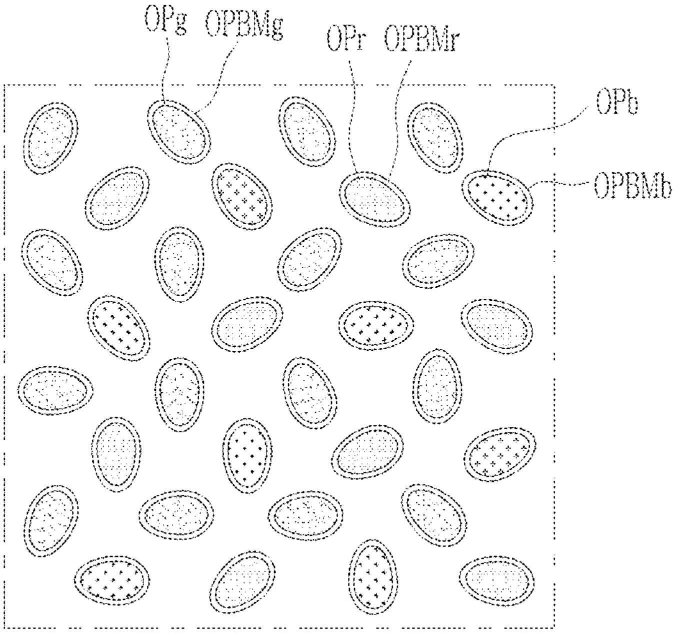
FIGS. 19A-19B respectively show a merged oval structure and a reflection characteristic thereof, according to some embodiments of the present disclosure.
Figure 19B:
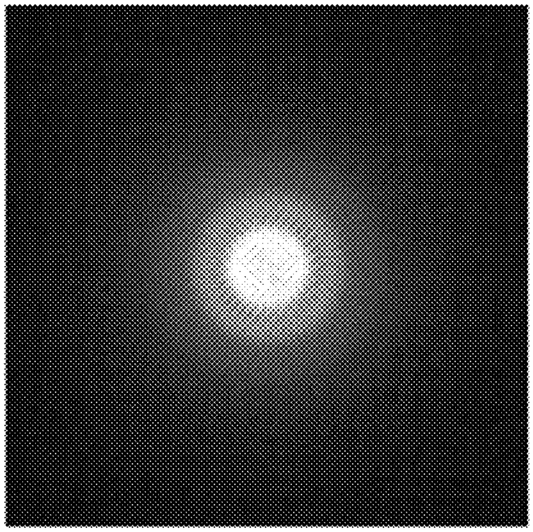

FIGS. 19A-19B show a merged oval structure according to some embodiments of the present disclosure and a reflection characteristic thereof.

FIG. 19A shows some embodiments in which the openings of respective colors have the same merged oval shape but the long-axis directions have five or more different angles.

FIG. 19B shows diffraction characteristic of the reflected light of FIG. 19A. Compared with the comparative example of FIG. 11A, it is found that the diffraction characteristic of FIG. 19B has a blurry reflected diffraction pattern so the ring shape is less distinct and the color separation is also difficult for the user to easily recognize or discern. As a result, embodiments like FIG. 19A may also have improved displaying quality, compared to the comparative example (of circular openings).

In embodiments described with reference to FIG. 17 to FIG. 19, the illustration and description are centered on the example of merging two different oval shapes, however, depending on the embodiments, it is possible to merge at least two oval shapes with different eccentricities.

The embodiments of merging two or more oval shapes as described above have a reflective diffraction pattern with a blurred diffraction characteristic in a manner similar to FIG. 19B so the ring shape is less clear and the color separation is difficult for the user to easily recognize, resulting in improved display quality compared to the comparative example.

In addition, the oval shapes of the openings OPr, OPg, and OPb of the pixel defining layer 380 and the oval shapes of the openings OPBMr, OPBMg, and OPBMb of the corresponding light blocking layer 220 may have a constant gap on the plane or may have different gaps depending on locations.

That is, depending on the embodiments, the number or the eccentricity of the oval shapes merged by the oval shapes of the openings OPr, OPBMg, and OPb of the pixel defining layer 380 may be different from the number or the eccentricity of the oval shapes merged by the oval shapes of the openings OPBMr, OPBMg, and OPBMb of the corresponding the light blocking layer 220.

When the oval shapes of the openings OPr, OPg, and OPb of the pixel defining layer 380 and the oval shapes of the openings OPBMr, OPBMg, and OPBMb of the corresponding light blocking layer 220 are different from each other as described above, similar to FIG. 19B, the diffraction characteristic has a blurred reflective diffraction pattern so the ring shape is less clear and the color separation is difficult for the user to easily recognize, resulting in improved display quality compared to the comparative example.

In some examples, the opening of some colors may have a circular shape rather than an oval shape, and such embodiments will now be further described with reference to FIG. 20.

Figure 20:
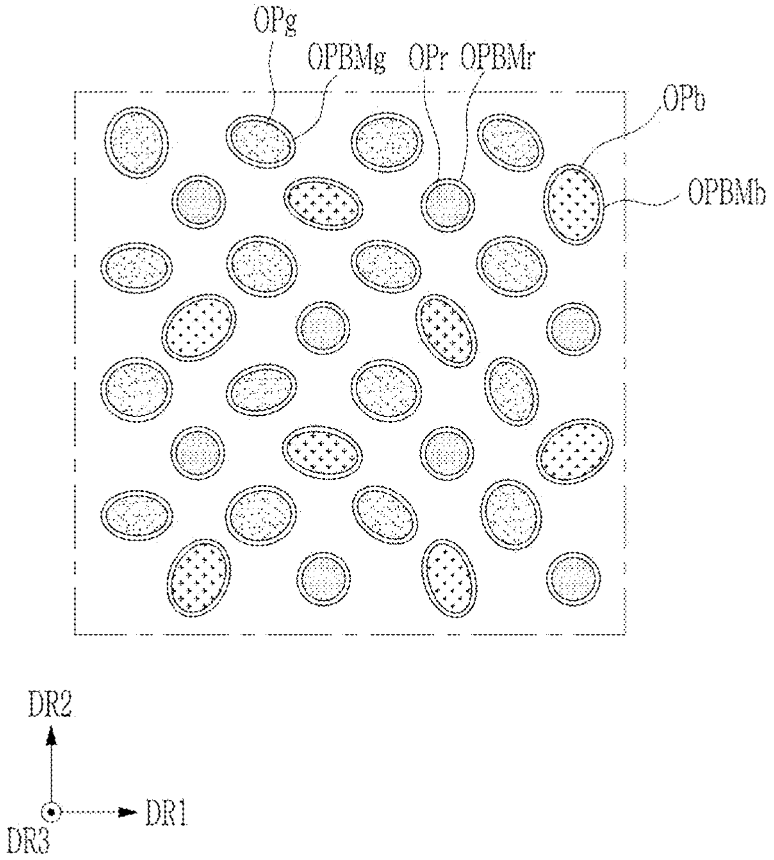
FIG. 20 shows a top plan view of a portion of a display panel according to some other embodiments of the present disclosure.

FIG. 20 is a plan view of a portion of a display panel according to some other embodiments of the present disclosure.

FIG. 20 is based on the embodiment of FIG. 9, and is different from FIG. 9 in that the red opening OPr of the pixel defining layer 380 and the red opening OPBMr of the light blocking layer 220 do not have the oval shapes but have circular shapes. That is, the green opening OPg and the blue opening OPb of the pixel defining layer 380 and the green opening OPBMg and the blue opening OPBMb of the light blocking layer 220 have the oval shapes.

In some examples, another color in addition to the red color from among the openings of three colors may also have a circular shape. That is, in some examples, one or two of the red opening OPr, the green opening OPg, and the blue opening OPb of the pixel defining layer 380 may have circular shapes, and the other(s) may have an oval shape. Further, the red opening OPBMr, the green opening OPBMg, and the blue opening OPBMb of the light blocking layer 220 may have shapes that correspond to the respective planar shapes of the red opening OPr, the green opening OPg, and the blue opening OPb of the corresponding pixel defining layer 380, and may have a constant horizontal gap from the red opening OPr, the green opening OPg, and the blue opening OPb of the pixel defining layer 380. In such examples, when the openings OPr, OPg, and OPb of the pixel defining layer 380 have an oval shape, the openings OPBMr, OPBMg, and OPBMb of the light blocking layer 220 corresponding thereto may also have an oval shape, and the openings OPr, OPg, and OPb of the pixel defining layer 380 and the openings OPBMr, OPBMg, and OPBMb of the light blocking layer 220 corresponding to each other may have a same long-axis direction in an oval shape.

Referring to FIG. 20, similar to the embodiments of FIG. 9, the openings in an oval shape from among the openings OPBMr, OPBMg, and OPBMb of the light blocking layer 220 and the openings OPr, OPg, and OPb of the pixel defining layer 380 may be formed to have oval shapes with different eccentricities for the same color, and the angles formed by the respective long axes of the openings in an oval shape from among the openings OPBMr, OPBMg, and OPBMb of the light blocking layer 220 and the openings OPr, OPg, and OPb of the pixel defining layer 380 may have five or more angles, which may be at intervals of less than or equal to 36 degrees. Here, the eccentricity of the oval shape may have a range of 0.2 to 0.85. In some examples, the long-axis directions of the oval shapes from among the openings OPr, OPg, and OPb of the pixel defining layer 380 or the openings OPBMr, OPBMg, and OPBMb of the light blocking layer 220 may be formed at regular intervals or at irregular intervals.

In the embodiments of FIG. 20, at least one pair from among the openings OPr, OPg, and OPb of the pixel defining layer 380 and the openings OPBMr, OPBMg, and OPBMb of the light blocking layer 220 may have an oval shape. As a result, as described above, less color separation of external light may occur or constant diffraction pattern or color separation may occur regardless of the angle, which is desirable.

Alternatively, the embodiment of FIG. 20 shows modification of the oval shape for one or two colors of the embodiments of FIG. 9 into the circular shape, and the embodiments of FIG. 7 or FIG. 8 may modify the oval shape for one or two colors into the circular shape. In addition, the embodiment of FIG. 18 and FIG. 19 may modify the oval shape for one or two colors into the circular shape.

Reflection characteristics with respect to eccentricity according to various embodiments will now be described with reference to FIG. 21 and FIG. 22.

Figure 21:
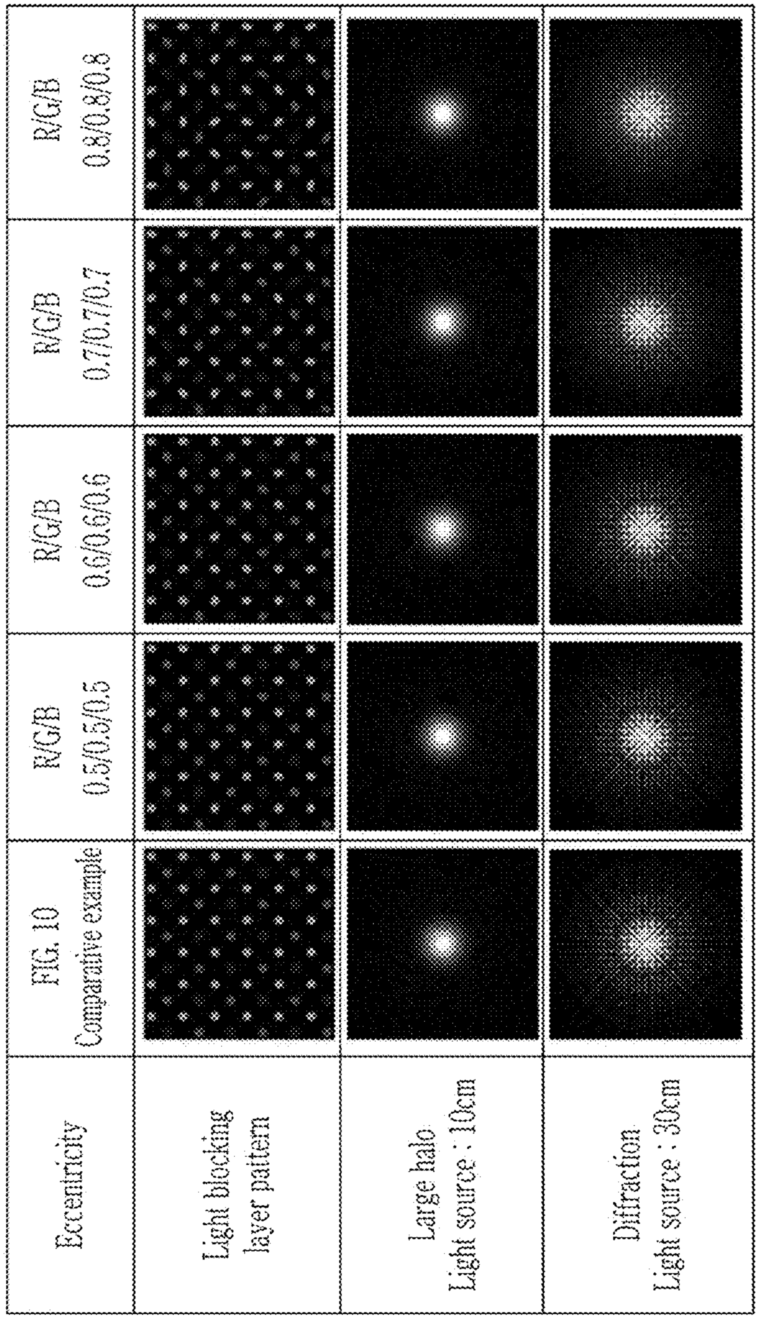
FIG. 21 and FIG. 22 show reflection characteristics with respect to eccentricity, according to some embodiments of the present disclosure.
Figure 22:
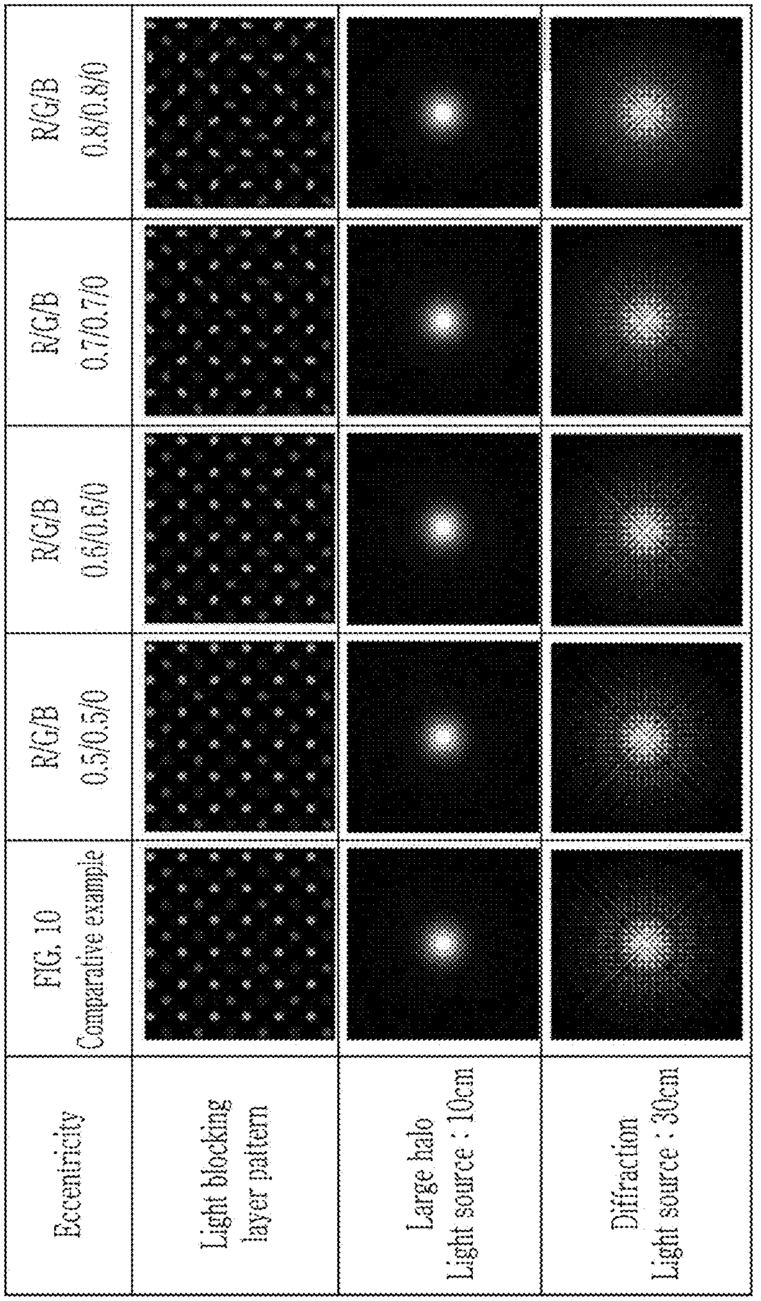

FIG. 21 and FIG. 22 show the reflection characteristics with respect to eccentricity.

FIG. 21 shows the reflection characteristics changing the eccentricity in the display device with the same eccentricity as FIG. 7. Eccentricity values given in FIG. 21 represent values of the openings OPBMr, OPBMg, and OPBMb of the light blocking layer 220.

FIG. 21 includes two sets of photographs, one set taken with external light provided at 10 cm, and the other photo taken with external light provided at 30 cm. Here, the photographs taken at 10 cm show the size and intensity of a halo that occurs around strong light, and the photographs taken at 30 cm show the characteristic of diffraction caused by reflection of external light.

Referring to FIG. 21, external light is reflected, and the halo, a ring-shaped pattern, is strongly visible in Comparative Example of FIG. 10, but the ring-shaped halo is not visible in the cases that the eccentricity is 0.5, 0.6, 0.7, and 0.8 in the embodiment using an ellipse, which is desirable.

Similar to FIG. 20, FIG. 22 shows the reflection characteristics in the embodiment in which one color has a circular shape instead of the oval shape, and the other two colors have an oval shape. Differing from FIG. 20, FIG. 22 shows that the blue color has the circular shape, and in detail, the blue opening OPb of the pixel defining layer 380 and the blue opening OPBMb of the light blocking layer 220 have the circular shape, and the remaining opening has the oval shape. In such cases, FIG. 22 shows the reflection characteristics while modifying the eccentricity of the opening in an oval shape. The eccentricity values in FIG. 22 represent values of the openings OPBMr, OPBMg, and OPBMb of the light blocking layer 220, and 0 indicates the circular shape.

Referring to FIG. 22, external light is reflected and the halo that is a ring-shaped pattern is strongly visible in the Comparative Example of FIG. 10, but the halo is invisible in the embodiments including at least one oval, which is an improvement over the Comparative Example of FIG. 10.

Further, the halo is not seen in the photographs of FIG. 22 that correspond to the embodiment of FIG. 20 and the photographs corresponding to the embodiments of FIG. 7 shown in FIG. 21, so it is found that the embodiments of FIG. 20 has an effect that substantially corresponds to FIG. 7.

Other modified embodiments will now be described with reference to FIG. 23 to FIG. 25.

Figure 23:
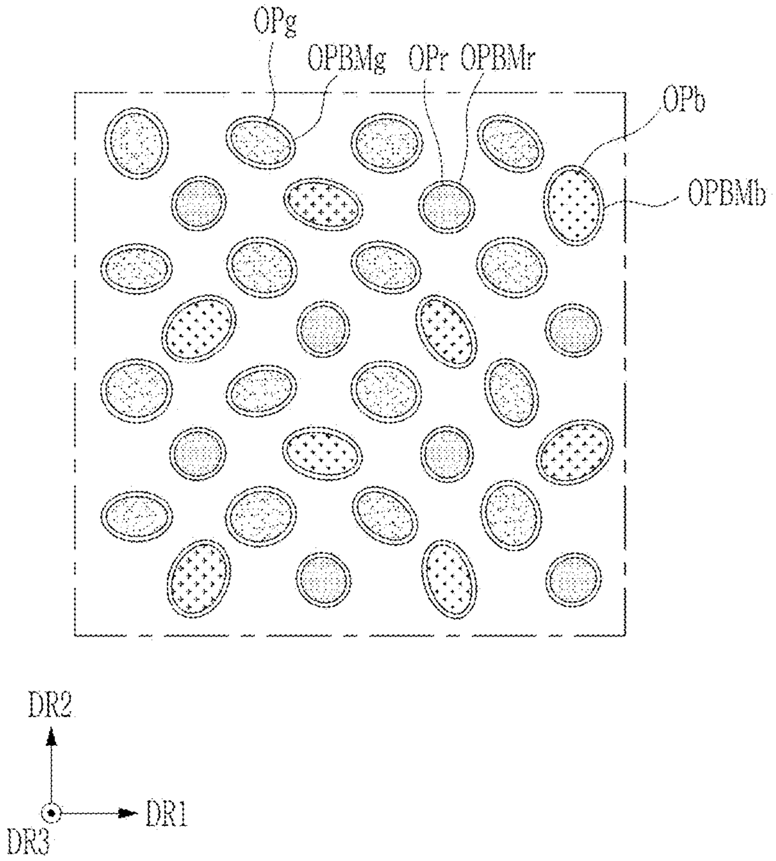
FIG. 23 to FIG. 25 show top plan views of a portion of a display panel according to some other embodiments of the present disclosure.
Figure 24:
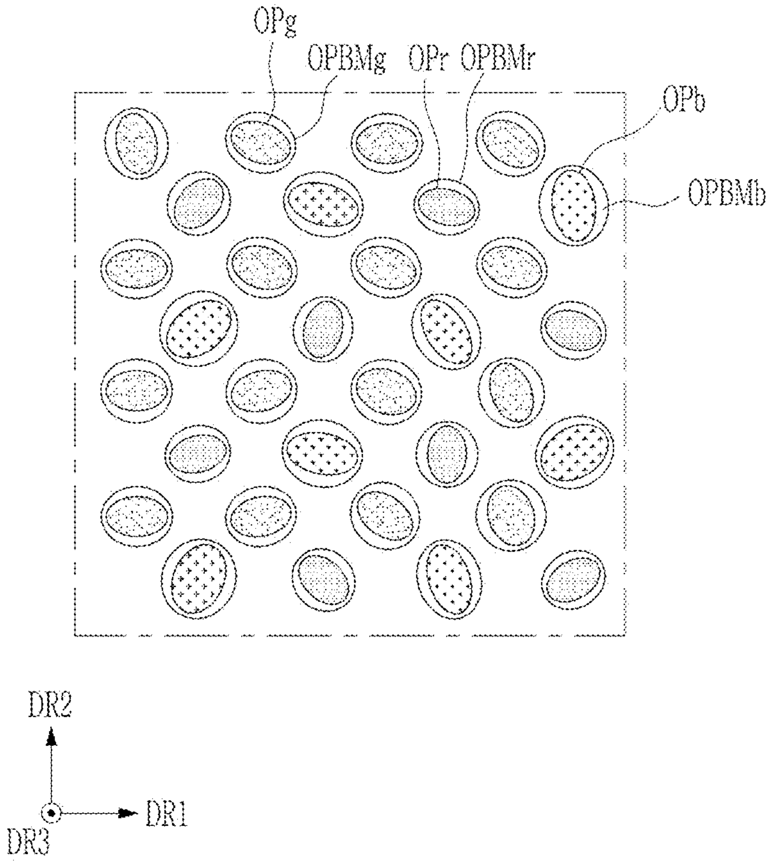
Figure 25:
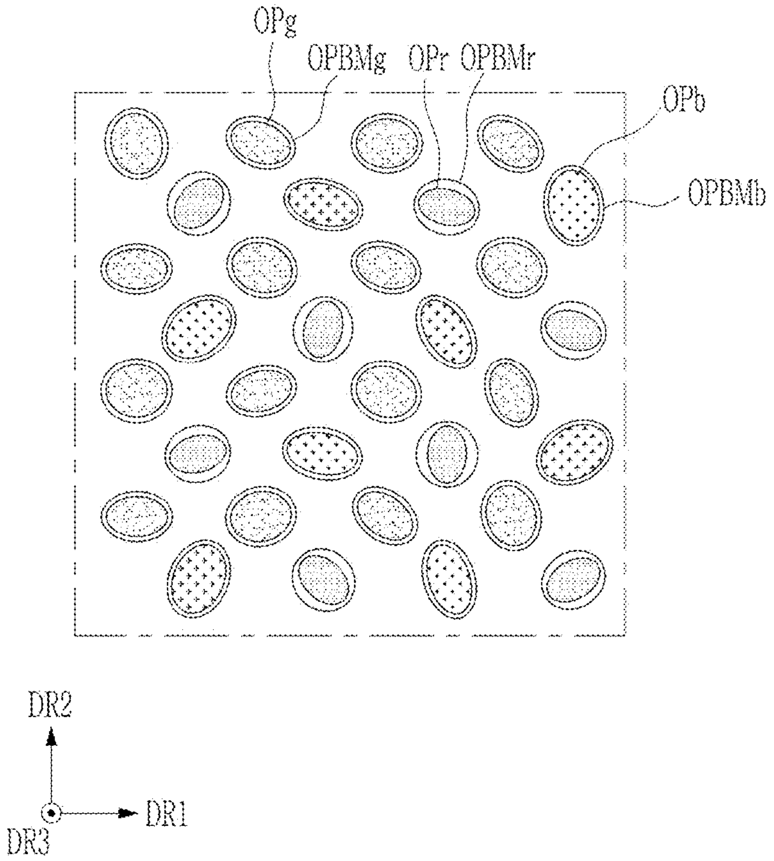

FIG. 23 to FIG. 25 show top plan views of a portion of a display panel according to some other embodiments of the present disclosure.

Referring to FIG. 20 and FIG. 22, it is found that the embodiments, in which one or two colors have oval shapes and the other(s) have a circular shape(s), have the effect that substantially corresponds to the embodiments in which all colors have oval shapes.

Therefore, in some examples, it is found that, when the oval shape is used instead of the circular shape, and it has the eccentricity (greater than 0 and less than 0.2) that is not the above-limited eccentricity (equal to or greater than 0.2 and equal to or less than 0.85), similar effects may be obtained. One of such embodiments will now be described with reference to FIG. 23.

FIG. 23 illustrates a modification to the embodiments of FIG. 20, in which the oval shape with eccentricity of greater than 0 and less than 0.2 is utilized instead of the circular shape of the two red openings OPr and OPBMr in FIG. 20.

In further detail, the embodiments of FIG. 23 are based on the embodiments of FIG. 9, and are different from the embodiments of FIG. 9 and FIG. 20 in that the red opening OPr of the pixel defining layer 380 and the red opening OPBMr of the light blocking layer 220 have the oval shape with eccentricity of greater than 0 and less than 0.2. That is, the green opening OPg and the blue opening OPb of the pixel defining layer 380 and the green opening OPBMg and the blue opening OPBMb of the light blocking layer 220 have the oval shapes with eccentricity of equal to or greater than 0.2 and equal to or less than 0.85.

In some examples, another color in addition to the red color from among the openings of three colors may also have an oval shape with the eccentricity of greater than 0 and less than 0.2. That is, in some examples, one or two of the red opening OPr, the green opening OPg, and the blue opening OPb of the pixel defining layer 380 may have oval shapes with the eccentricity of greater than 0 and less than 0.2, and the other(s) may have an oval shape with the eccentricity of equal to or greater than 0.2 and equal to or less than 0.85. Further, the red opening OPBMr, the green opening OPBMg, and the blue opening OPBMb of the light blocking layer 220 may have shapes that correspond to the respective planar shapes of the red opening OPr, the green opening OPg, and the blue opening OPb of the pixel defining layer 380, and may have a constant horizontal gap from the red opening OPr, the green opening OPg, and the blue opening OPb of the pixel defining layer 380. In such examples, the oval-shaped long-axis directions of the openings OPr, OPg, and OPb of the pixel defining layer 380 and the openings OPBMr, OPBMg, and OPBMb of the light blocking layer 220 corresponding thereto may have the same direction.

Referring to FIG. 23, similar to the embodiments of FIG. 9, the openings OPBMr, OPBMg, and OPBMb of the light blocking layer 220 and the openings OPr, OPg, and OPb of the pixel defining layer 380 may be formed to have oval shapes with different eccentricities for the same color, and the angles formed by the respective long axes of the openings OPBMr, OPBMg, and OPBMb of the light blocking layer 220 and the openings OPr, OPg, and OPb of the pixel defining layer 380 may have five or more angles, which may be formed at intervals of less than or equal to 36 degrees. In some examples, the long-axis directions of the oval shapes from among the openings OPr, OPg, and OPb of the pixel defining layer 380 or the openings OPBMr, OPBMg, and OPBMb of the light blocking layer 220 may be formed at regular intervals or at irregular intervals.

In the embodiments of FIG. 23, at least one pair from among the openings OPr, OPg, and OPb of the pixel defining layer 380 and the openings OPBMr, OPBMg, and OPBMb of the light blocking layer 220 may have an oval shape with eccentricity of equal to or greater than 0.2 and equal to or less than 0.85. As a result, as described above, less color separation of external light may occur or constant diffraction pattern or color separation may occur regardless of the angle, which is desirable.

FIG. 23 shows modification of the oval shape for one or two colors of the embodiments of FIG. 9 into the oval shape with the eccentricity of greater than 0 and less than 0.2, and the embodiments of FIG. 7 or FIG. 8 may modify the oval shape for one or two colors into the oval shape with the eccentricity of greater than 0 and less than 0.2. In addition, the embodiments of FIG. 18 and FIG. 19 may modify the oval shape for one or two colors into the oval shape with the eccentricity of greater than 0 and less than 0.2.

In the above description, the embodiments in which the openings OPr, OPg, and OPb of the pixel defining layer 380 and the corresponding openings OPBMr, OPBMg, and OPBMb of the light blocking layer 220 have a predetermined gap on the plane have been mainly described.

However, in some embodiments, the horizontal gap between the openings OPr, OPg, and OPb of the pixel defining layer 380 and the corresponding openings OPBMr, OPBMg, and OPBMb of the light blocking layer 220 may be changed according to the position. Such embodiments will now be described with reference to FIG. 24 and FIG. 25. Here, the horizontal gap between the openings OPr, OPg, and OPb of the pixel defining layer 380 and the corresponding openings OPBMr, OPBMg, and OPBMb of the light blocking layer 220 may be equal to or greater than 4.5 μm and equal to or less than 10 μm.

FIG. 24 shows embodiments in which the red, green, and blue openings OPBMr, OPBMg, and OPBMb of the light blocking layer 220 and the openings OPr, OPg, and OPb of the pixel defining layer 380 are formed to have oval shapes with different eccentricities.

Referring to FIG. 24, the eccentricity of the openings OPBMr, OPBMg, and OPBMb of the light blocking layer 220 may be smaller than the eccentricity of the corresponding openings OPr, OPg, and OPb of the pixel defining layer 380. However, in some examples, the eccentricity of the openings OPr, OPg, and OPb of the pixel defining layer 380 may be smaller than the eccentricity of the corresponding openings OPBMr, OPBMg, and OPBMb of the light blocking layer 220.

In the embodiments of FIG. 24, the respective horizontal gaps of the openings OPr, OPg, and OPb of the pixel defining layer 380 and the corresponding openings OPBMr, OPBMg, and OPBMb of the light blocking layer 220 are not constant, and there are positions with wide widths and positions with narrow widths.

Here, the long-axis directions of the oval shapes of the openings OPr, OPg, and OPb of the pixel defining layer 380 and the openings OPBMr, OPBMg, and OPBMb of the light blocking layer 220 may be the same.

As shown in FIG. 24, it is found that, when the horizontal gaps between the openings OPr, OPg, and OPb of the pixel defining layer 380 and the corresponding openings OPBMr, OPBMg, and OPBMb of the light blocking layer 220 are not constant, the color separation of external light may be less generated or uniform diffraction pattern or color separation may be generated by various directions or eccentricities, which is desirable. In addition, when the external light is reflected, the halo in a ring-shaped pattern may be invisible.

Regarding the embodiments of FIG. 24, in a manner similar to the embodiments of FIG. 9, the openings OPBMr, OPBMg, and OPBMb of the light blocking layer 220 and the openings OPr, OPg, and OPb of the pixel defining layer 380 are formed to have oval shapes with different eccentricities for the same color, and the angles formed by the respective long axes of the openings OPBMr, OPBMg, and OPBMb of the light blocking layer 220 and the openings OPr, OPg, and OPb of the pixel defining layer 380 may have five or more angles, which may be at angles of less than or equal to 36 degrees. Here, the eccentricity of the oval shape may have a range of equal to or greater than 0.2 and equal to or less than 0.85. In some examples, the long-axis directions of the oval shapes from among the openings OPr, OPg, and OPb of the pixel defining layer 380 or the openings OPBMr, OPBMg, and OPBMb of the light blocking layer 220 may be formed at regular intervals or at irregular intervals.

In some examples, a portion on which the horizontal gaps are not constant may be applied to one or two colors in a manner similar to the embodiments of FIG. 24. Such embodiments will now be described with reference to FIG. 25.

The embodiments of FIG. 25 are based on the embodiments of FIG. 24, and the red opening OPr of the pixel defining layer 380 and the red opening OPBMr of the light blocking layer 220 do not have a constant horizontal gap, and the green opening OPg and the blue opening OPb of the pixel defining layer 380 and the green opening OPBMg and the blue opening OPBMb of the light blocking layer 220 have a constant horizontal gap.

In some examples, another color in addition to the red color from among the openings of three colors may have the horizontal gap that is not constant. That is, in some examples, one or two of the red opening OPr, the green opening OPg, and the blue opening OPb of the pixel defining layer 380 and the corresponding red opening OPBMr, the green opening OPBMg, and the blue opening OPBMb of the light blocking layer 220 may have the horizontal gap that is not constant.

In the embodiments of FIG. 25, at least one pair of the openings OPr, OPg, and OPb of the pixel defining layer 380 and the openings OPBMr, OPBMg, and OPBMb of the light blocking layer 220 have the constant horizontal gap. As a result, as described above, less color separation of external light may occur or constant diffraction pattern or color separation may occur regardless of the angle, which is desirable. Further, the halo in the ring shape may be invisible when the external light is reflected.

The embodiments of FIG. 24 and FIG. 25 are modified based on the embodiments of FIG. 9, and they may be modified so that the horizontal gaps may not be constant. In addition, the embodiments of FIG. 18 and FIG. 19 may be modified so that the horizontal gaps may not be constant.

A structure of one unit pixel will now be described with reference to FIG. 26.

FIGS. 26A-26D show top plan views of a configuration of one unit pixel of a display panel according to some embodiments of the present disclosure.

Figure 26A:
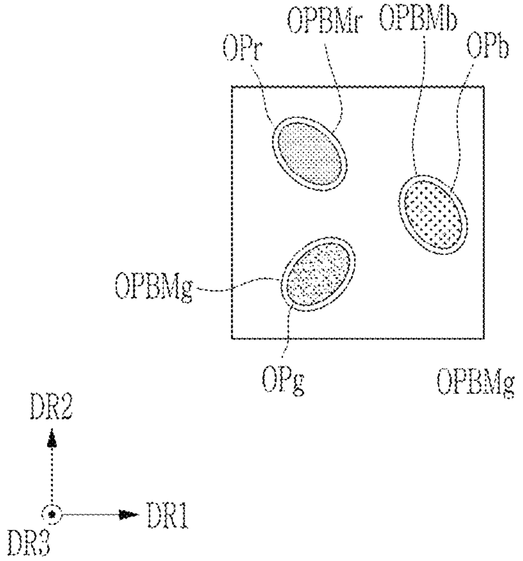
FIGS. 26A-26D show top plan views of a configuration of one unit pixel of a display panel according to some embodiments of the present disclosure.

FIG. 26A shows embodiments in which one red light emitting region, one green light emitting region, and one blue light emitting region are included to configure the unit pixel. In detail, one red opening OPr, one green opening OPg, and one blue opening OPb of the pixel defining layer 380 and one red opening OPBMr, one green opening OPBMg, and one blue opening OPBMb of the light blocking layer 220 are included in the unit pixel.

Figure 26B:
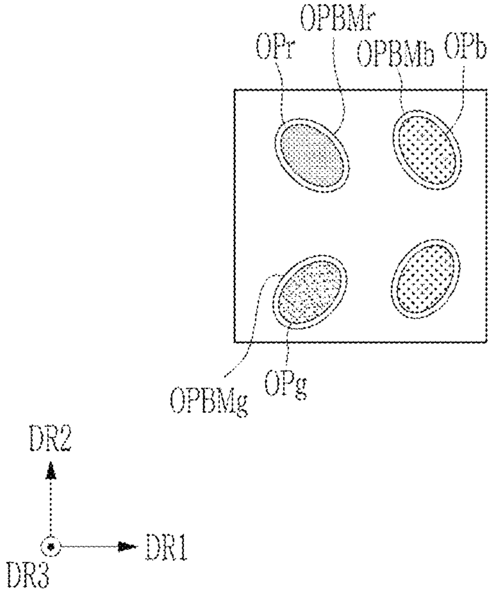
Figure 26C:
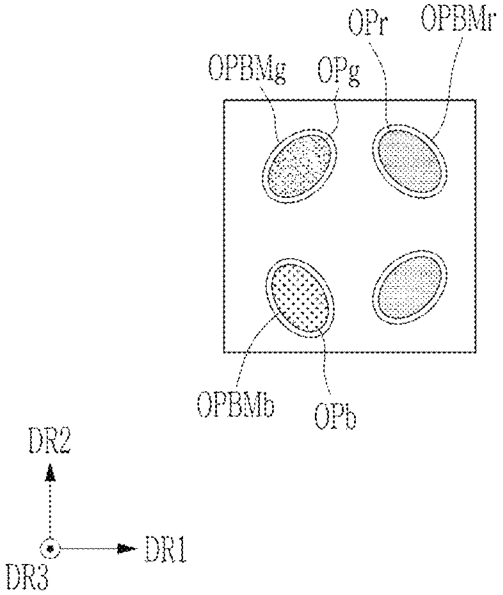
Figure 26D:
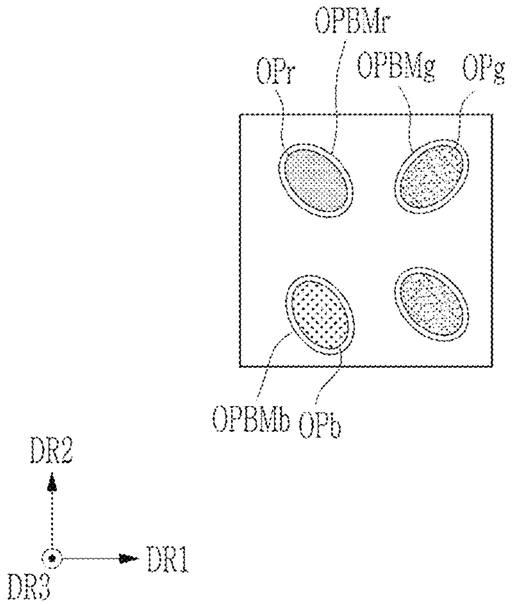

However, in some examples, as shown in FIG. 26B, FIG. 26C, and FIG. 26D, two light emitting regions of one color may be included and the unit pixel including four light emitting regions may be provided.

FIG. 26B shows a unit pixel including two blue light emitting regions, FIG. 26C shows a unit pixel including two red light emitting regions, and FIG. 26D shows a unit pixel including two green light emitting regions.

For example, the unit pixel of FIG. 26B includes two blue openings OPb of the pixel defining layer 380 and two blue openings OPBMb of the light blocking layer 220. In this instance, the two blue openings OPb of the pixel defining layer 380 and the two blue openings OPBMb of the light blocking layer 220 may have different eccentricities, and the long-axis directions thereof may be different.

The unit pixel of FIG. 26C includes two red openings OPr of the pixel defining layer 380 and two red openings OPBMr of the light blocking layer 220. In this instance, the two red openings OPr of the pixel defining layer 380 and the two red openings OPBMr of the light blocking layer 220 may have different eccentricities, and the long-axis directions thereof may be different.

The unit pixel of FIG. 26D includes two green openings OPg of the pixel defining layer 380 and two green openings OPBMg of the light blocking layer 220. In this instance, the two green openings OPg of the pixel defining layer 380 and the two green openings OPBMg of the light blocking layer 220 may have different eccentricities, and the long-axis directions thereof may be different.

The openings OPr, OPg, and OPb of the pixel defining layer 380 and the openings OPBMr, OPBMg, and OPBMb of the light blocking layer 220 or their modified examples may be applied to the respective unit pixels of FIG. 26.

While this disclosure has been described in connection with what is presently considered to be practical examples, it is to be understood that the disclosure is not limited to the disclosed embodiments, but, on the contrary, is intended to cover various modifications and equivalent arrangements included within the spirit and scope of the present disclosure as define by the appended claims, and equivalents thereof.

DESCRIPTION OF SYMBOLS

380: pixel defining layer
220: light blocking layer
OP, OPr, OPg, OPb: opening of pixel defining layer
OPBM, OPBMr, OPBMg, OPBMb: opening of light blocking layer
230, 230R, 230G, 230B: color filter
Anode: anode
Cathode: cathode
EML: emission layer
FL: functional layer
1000: display device
DP: display panel
110: substrate
180: organic film
385, 385-1, 385-2: spacer
400, 401, 402, 403: encapsulation layer
501, 510, 511: sensing insulating layer
540, 541: sensing electrode
550: planarization layer
DA, DA1-1, DA1-2: display area
EA, EA1, EA2: component region

What is claimed is:

1. A light emitting display device comprising:
a substrate;
a plurality of anodes on the substrate;
a pixel defining layer having a plurality of first openings overlapping the anodes;
a plurality of emission layers in the first openings of the pixel defining layer;
a cathode formed on the emission layers and the pixel defining layer;
an encapsulation layer on the cathode; and
a light blocking layer on the encapsulation layer and having a plurality of second openings corresponding to the first openings,
wherein the first openings and the second openings respectively have an oval shape in a plan view, and
wherein long-axis angles of the second openings comprise at least five different angles in a range from 0° to less than 180°.

2. The light emitting display device of claim 1, wherein an angle formed by long-axis directions of respective oval shapes of two of the second openings is less than or equal to 36 degrees.

3. The light emitting display device of claim 2, wherein one of the second openings has an eccentricity of 0.2 to 0.85.

4. The light emitting display device of claim 3, wherein the first openings and the second openings overlapping the first openings in a plan view are formed at regular intervals in a plan view.

5. The light emitting display device of claim 3, wherein one of the first openings and one of the second openings overlapping the one of the first openings in a plan view have a horizontal gap of 4.5 μm to 10 μm.

6. The light emitting display device of claim 1, wherein long-axis directions of respective oval shapes of one of the first openings and one of the second openings overlapping the one of the first openings in a plan view are the same or form an angle of less than or equal to 10 degrees.

7. The light emitting display device of claim 1, further comprising:

a color filter in the respective second openings.

8. A light emitting display device comprising:

a substrate;

a plurality of anodes on the substrate;

a pixel defining layer having a plurality of first openings overlapping the anodes;

a plurality of emission layers in the first openings of the pixel defining layer;

a cathode formed on the emission layers and the pixel defining layer;

an encapsulation layer on the cathode;

a light blocking layer on the encapsulation layer and having a plurality of second openings corresponding to the first openings; and a plurality of color filters in the second openings of the light blocking layer, wherein the first openings and the second openings have oval shapes in a plan view, wherein respective oval shapes of two of the second openings have different eccentricities, and wherein one of the second openings has an eccentricity of 0.2 to 0.85.

9. The light emitting display device of claim 8, wherein the color filters comprise a color filter of a first color, a color filter of a second color, and a color filter of a third color, and wherein two of the second openings corresponding to a color filter of a same color have different eccentricities.

10. The light emitting display device of claim 9, wherein one of the first openings has an eccentricity of 0.2 to 0.85.

11. The light emitting display device of claim 9, wherein a long-axis angle of the second openings comprises at least five directions, and wherein an angle formed by long-axis directions of respective oval shapes is less than or equal to 36 degrees.

12. The light emitting display device of claim 11, wherein long-axis directions of oval shapes of one of the first openings and one of the second openings overlapping the one of the first openings in a plan view are the same or form an angle of less than or equal to 10 degrees.

13. The light emitting display device of claim 9, wherein the first openings and the second openings overlapping the same in a plan view are formed at regular intervals in a plan view.

14. The light emitting display device of claim 9, wherein one of the first openings and one of the second openings overlapping the one of the first openings in a plan view have a horizontal gap of 4.5 μm to 10 μm.

15. A light emitting display device comprising:

a substrate;

an anode on the substrate;

a pixel defining layer having a first opening overlapping the anode;

an emission layer in the first opening of the pixel defining layer;

a cathode formed on the emission layer and the pixel defining layer;

an encapsulation layer on the cathode; and a light blocking layer on the encapsulation layer and having a second opening corresponding to the first opening, wherein the second opening has a shape that is a merging of only two oval shapes with different eccentricities in a plan view, and wherein the second opening has a planar shape formed by cutting a first oval shape with first eccentricity and a second oval shape with second eccentricity in a common first direction and combining them.

16. The light emitting display device of claim 15, wherein the first opening or the second opening has an eccentricity of 0.2 to 0.85.

17. The light emitting display device of claim 16, wherein the second opening comprises a plurality of second openings, long-axis angles of the second openings comprising at least five different directions, and wherein an angle formed by long-axis directions of respective oval shapes is less than or equal to 36 degrees.

18. The light emitting display device of claim 17, wherein long-axis directions of respective oval shapes of the first opening and the second opening overlapping the same in a plan view are the same or form an angle of less than or equal to 10 degrees.

19. The light emitting display device of claim 17, wherein the first opening comprises a plurality of first openings and the second opening comprises a plurality of second openings, and wherein the second openings overlapping the first openings in a plan view are at regular intervals in a plan view or have a horizontal gap of 4.5 μm to 10 μm.

* * * * *